United States Patent [19]
Miyazawa

[11] Patent Number: 5,881,086
[45] Date of Patent: *Mar. 9, 1999

[54] OPTICAL SEMICONDUCTOR DEVICE WITH QUANTUM WIRES, FABRICATION METHOD THEREOF, AND LIGHT SOURCE APPARATUS, AND OPTICAL COMMUNICATION SYSTEM USING THE SAME

[75] Inventor: Seiichi Miyazawa, Zama, Japan

[73] Assignee: Canon Kabushiki Kaisha, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 729,576

[22] Filed: Oct. 11, 1996

[30] Foreign Application Priority Data

Oct. 19, 1995 [JP] Japan .................................. 7-296262
Dec. 8, 1995 [JP] Japan .................................. 7-345841
Jan. 29, 1996 [JP] Japan .................................. 8-034381

[51] Int. Cl.⁶ .............................. H01S 3/19; H04B 10/00
[52] U.S. Cl. .............................. 372/46; 359/156; 372/50; 372/96
[58] Field of Search ................................. 372/50, 45, 46, 372/26, 27, 96, 102; 359/156

[56] References Cited

U.S. PATENT DOCUMENTS 4,918,701  4/1990  Amann et al. ............................ 372/50
5,528,615  6/1996  Shima ...................................... 372/45
5,608,229  3/1997  Mukai ...................................... 372/44

FOREIGN PATENT DOCUMENTS 2-117190  5/1990  Japan .

OTHER PUBLICATIONS

Ishikawa et al., "LiNbO₂ Optical Wavelength For Bi-directional Transmission in Optical CATV Subscriber Systems", OCS pp. 82–91, 1991. (no month).

*Primary Examiner*—James W. Davie
*Attorney, Agent, or Firm*—Fitzpatrick, Cella, Harper & Scinto

[57] ABSTRACT

An optical semiconductor device includes a semiconductor substrate, a first region formed on the substrate and a second region formed on the substrate. The first region has a first active layer, and the second region has a second active layer. At least one of the first active layer and the second active layer contains quantum wires which extend in a cavity direction of the device. The device is constructed such that the first active layer and the second active layer can be stimulated independently from each other.

46 Claims, 22 Drawing Sheets

OPTICAL SEMICONDUCTOR DEVICE WITH QUANTUM WIRES, FABRICATION METHOD THEREOF, AND LIGHT SOURCE APPARATUS, AND OPTICAL COMMUNICATION SYSTEM USING THE SAME

BACKGROUND OF THE INVENTION

1. Field of the Invention

The present invention relates to a semiconductor optical device having quantum wires, such as an oscillation polarization mode selective semiconductor laser whose oscillation polarization mode can be changed by a modulation current injected thereinto and a polarization-insensitive optical amplifier which can amplify input light substantially irrespective of its polarization mode, and a method for fabricating the semiconductor optical device. The present invention also relates to a light source apparatus, an optical communication method and an optical communication system using the optical semiconductor device with quantum wires.

2. Related Background Art

As an oscillation polarization mode selective dynamic single mode semiconductor laser, the following device has been developed and proposed. The oscillation polarization mode selective device has a structure that can be modulated by a digital signal which is produced by superposing a minute-amplitude digital signal on a bias injection current. The device is a distributed feedback (DFB) laser in which a distributed reflector of a grating is introduced into a semiconductor laser resonator or cavity and wavelength selectivity of the grating is utilized. In the device, strain is introduced into an active layer of a quantum well structure, or its Bragg wavelength is located at a position shorter than a peak wavelength of a gain spectrum, so that gains for transverse electric (TE) mode and transverse magnetic (TM) mode are approximately equal to each other for light at wavelengths close to an oscillation wavelength, under a current injection condition near an oscillation threshold. Further, a plurality of electrodes are arranged and currents are unevenly injected through those electrodes. An equivalent refractive index of the cavity is unevenly distributed by the uneven current injection, and oscillation occurs in one of the TE mode and the TM mode and at a wavelength which satisfies a phase matching condition and takes a minimum threshold gain. When the balance of the uneven current injection is slightly changed to vary a competitive relation of the phase condition between the TE mode and the TM mode, the oscillation polarization mode and wavelength of the device can be switched.

In that semiconductor device, an antireflection coating is provided on one end facet to asymmetrically employ the effects of the uneven current injection into its output-side portion and its modulation-electrode portion. Alternatively, lengths of the electrodes are made different from each other to introduce structural asymmetry.

Further, Japanese Patent Laid-Open No. 2-117190 discloses a semiconductor laser apparatus in which two semiconductor devices are arranged serially or in parallel. One of devices principally oscillates or amplifies a wave in a predetermined polarization mode, and the other one chiefly oscillates or amplifies a wave in another polarization mode. Those devices are formed in a common layer or in parallel layers.

However, the above-discussed conventional oscillation polarization mode selective DFB semiconductor laser, which selects the oscillation polarization mode depending on the phase condition, is sensitive to the phase at the end facet. As a result, the oscillation wavelength and polarization mode of the device depend on the current injection condition in a complicated fashion, and fluctuation in characteristics of the oscillation polarization mode and the like appears among individual devices. If antireflection coatings are provided on both end facets to solve those disadvantages, asymmetry in a light propagation direction of the device is weakened and the effect of the uneven current injection would be reduced. Thus, stable switching of the oscillation polarization mode is lost.

In the apparatus of Japanese Patent Laid-Open No. 2-117190, the oscillation or amplification of the wave in a predetermined polarization mode is performed by selecting a device's geometric shape. As a result, yield is decreased, the amount depending on the fluctuation in etched depth and ridge width that occurs during a ridge fabrication process.

SUMMARY OF THE INVENTION

It is an object of the present invention to provide an optical semiconductor device with quantum wires, such as an oscillation polarization mode selective semiconductor laser and a polarization-insensitive optical amplifier, which has a good reproducibility and a stable operation, a method for fabricating the optical semiconductor device, a light source apparatus, an optical communication system and the like using the optical semiconductor device with quantum wires.

The invention is directed to an optical semiconductor device which includes a semiconductor substrate, a first region with a first active layer formed on the substrate, a second region with a second active layer formed on the substrate and in which at least one of the first active layer and the second active layer contains quantum wires extending in a cavity direction of the device.

According to one aspect of the present invention, there is provided an optical semiconductor device which includes a semiconductor substrate, a first region with a first active layer formed on the substrate, a second region with a second active layer formed on the substrate, quantum wires contained in at least one of the first active layer and the second active layer, extending in a cavity direction of the device, and a stimulating unit, such as a set of electrodes, for stimulating the first active layer and the second active layer independently from each other.

More specifically, the following structures are possible:

The first active layer and the second active layer respectively contain different kinds of quantum wires having different cross sections. Because those quantum wires are formed on the substrate, the polarization-mode dependency of gains of the device can be flexibly controlled.

At least one of the first active layer and the second active layer contains different kinds of quantum wires having different cross sections. Gain profiles for different polarization modes of the active layer with the different kinds of quantum wires can be regulated to a considerable extent.

The quantum wires are formed on a grating. The polarization-mode dependency of gains of the device can be flexibly controlled readily by controlling a pitch and so forth of the grating.

The grating has a cross-section of a rectangular shape or a trapezoidal shape. This grating has a small number of surface orientations and the quantum wires can be formed thereon stably and accurately, and hence oscillation directions of electric fields of polarization modes in the device can be effectively controlled.

The substrate comprises a substrate having a surface whose orientation is incwired from a {111} surface or a {110} surface by an angle in a range from 0 to 20 degrees, and the grating is formed on the substrate. When the angle is 0 (zero), the substrate surface is the {111} surface or the {110} surface itself. In this structure, a V-group surface is formed on a slant surface when III–V group elements are used. Using this characteristic, a current confinement structure for confining a current injected by the stimulating unit toward the quantum wire is constructed. The current confinement structure includes a layer doped with an amphoteric impurity (typically Si) and grown on the grating. Alternatively, the current confinement structure may include a layer simultaneously doped with Zn and Se and grown on the grating. Thus, current injection efficiency can be improved, and the polarization mode of the device can be effectively controlled by a low threshold current.

There is further arranged a spacer region for reducing scattering occurring between the first active layer and the second active layer, between the first active layer and the second active layer. The spacer region may be formed by forming a groove between the first region and the second region. The spacer region reduces scattering loss, which is likely to occur at a facet growth portion in the boundary between the first region and the second region, and a threshold of the device can be lowered.

There is further arranged a diffraction grating for selecting an oscillation wavelength of the device. The diffraction grating acts as a distributed feedback reflector for light in a propagation mode, and a dynamic single mode device or a tunable laser can be realized.

The first active layer is constructed such that a gain for a first mode of two polarization modes is approximately equal to or slightly larger than a gain for a second mode of two polarization modes, the second active layer is constructed such that a gain for the second mode is larger than a gain for the first mode and the second active layer contains the quantum wires. The polarization mode of the device can be flexibly controlled.

The first active layer contains different kinds of quantum wires having different cross sections. Gain profiles for different polarization modes of the first active layer can be regulated to a considerable extent.

The first active layer comprises a bulk active layer which has a simple structure.

There is further arranged a third region including a third active layer, the third active layer is constructed such that a gain for the first mode is larger than a gain for the second mode, and third active layer contains quantum wires. Thus, the polarization mode of the device can be still more flexibly controlled.

A low reflective film is provided on an end facet of the device, and hence the device can function as an optical amplifier.

According to another aspect of the present invention, there is provided a method for fabricating an optical semiconductor device described above in which a grating, whose grooves extend in the cavity direction, is formed on the substrate and the quantum wires are formed on the grating, using a difference in speed of growth on surfaces with different surface orientations of the grating. The quantum wires can be formed with a good reproducibility.

According to another aspect of the present invention, there is provided an optical communication system for communicating over a light transmission wire that transmits signals from a transmitter side to a receiver side. The system includes a light source which has the above-described optical semiconductor device and a polarization mode selecting unit, such as a polarizer, for selecting light in one of two different polarization modes emitted from the optical semiconductor device, a coupling unit for coupling light in one of the two different polarization modes from the semiconductor device to the light transmission wire, and a receiver for detecting the light in one of the two different polarization modes transmitted through the light transmission wire.

According to another aspect of the present invention, there is provided an opto-electric converting apparatus. The apparatus includes a light source which has the above-described optical semiconductor device and a polarization mode selecting unit for selecting light in one of two different polarization modes emitted from the optical semiconductor device, a coupling unit for coupling light in one of the two different polarization modes from the semiconductor device to a light transmission wire, and a receiver for detecting the light in one of the two different polarization modes transmitted through the light transmission wire.

According to another aspect of the present invention, there is provided a light source apparatus which includes the above-described optical semiconductor device and a polarization mode selecting unit for selecting light in one of two different polarization modes emitted from the semiconductor device.

According to yet another aspect of the present invention, there is provided an optical cable television system for communicating over a light transmission wire that transmits signal light from a broadcasting center to a subscriber side. The system includes a light source which has the above-described optical semiconductor device and a polarization mode selecting unit for selecting light in one of two different polarization modes emitted from the semiconductor device and which is disposed at the broadcasting center, a coupling unit for coupling light in one of the two different polarization modes from the semiconductor device to the light transmission wire, which is disposed at the broadcasting center, and a receiver and an optical filter for detecting light in one of the two different polarization modes transmitted through the light transmission wire, which are disposed on the subscriber side.

These advantages and others will be more readily understood in connection with the following detailed description of the preferred embodiments in conjunction with the drawings.

DESCRIPTION OF THE PREFERRED EMBODIMENT

Prior to description of embodiments of the present invention, a basic concept of the present invention will be described with reference to FIG. 1. In the present invention, a plurality of one-dimensional quantum wires are used in an active layer or region of an optical semiconductor structure, such as a semiconductor laser, so that the mode of a gain in the optical semiconductor device is controlled between the TE mode and the TM mode.

Figure 1A:
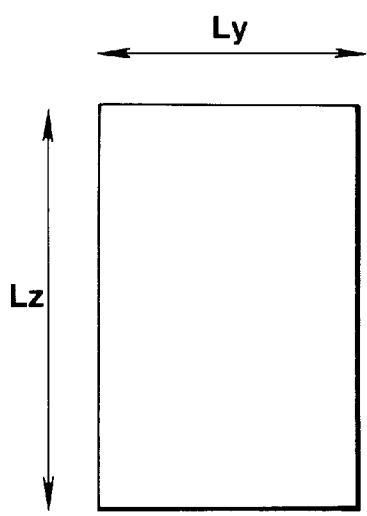
FIG. 1A illustrates the cross-section of a quantum wire used in an optical semiconductor device of the present invention.
Figure 1B:
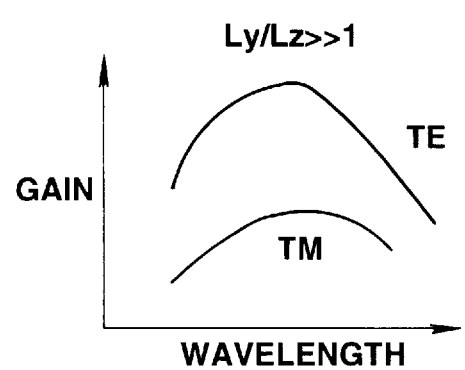
FIGS. 1B and 1C respectively illustrate relationships between wavelength dispersions of gains for the TE mode and the TM mode and the cross section of a quantum wire used in an optical semiconductor device of the present invention.
Figure 1C:
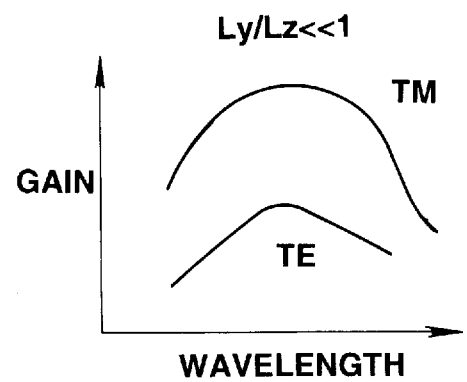

The polarization mode caused by the quantum wires is as follows: The quantum wire structure, whose cross section with respect to a plane perpendicular to its longitudinal direction is depicted in FIG. 1A, is used in the active layer, and the quantum wires are provided in parallel with a cavity direction. As shown in FIG. 1A, where the length of the cross section of the quantum wire in a layer-extending direction is $L_y$ and the length thereof in a layer-thickness direction is $L_z$, the gain profile is as illustrated in FIG. 1B when $L_y/L_z >> 1$ because the active layer constructed by the quantum wires becomes equivalent to a quantum thin film perpendicular to a z-direction (i.e, a direction of $L_z$). Thus, the gain for the TE polarization mode increases and becomes dominant. When $L_y = L_z$, gains for the TE mode and the TM mode are substantially equal to each other and the gain becomes polarization-insensitive. When $L_y/L_z < 1$, the gain exhibits the TM mode. The gain profile is as illustrated in FIG. 1C when $L_y/L_z$ is further lowered, because the active layer constructed by the quantum wires becomes equivalent to a quantum thin film parallel with the z-direction. Thus, the gain for the TM polarization mode increases and becomes dominant.

Figure 2:
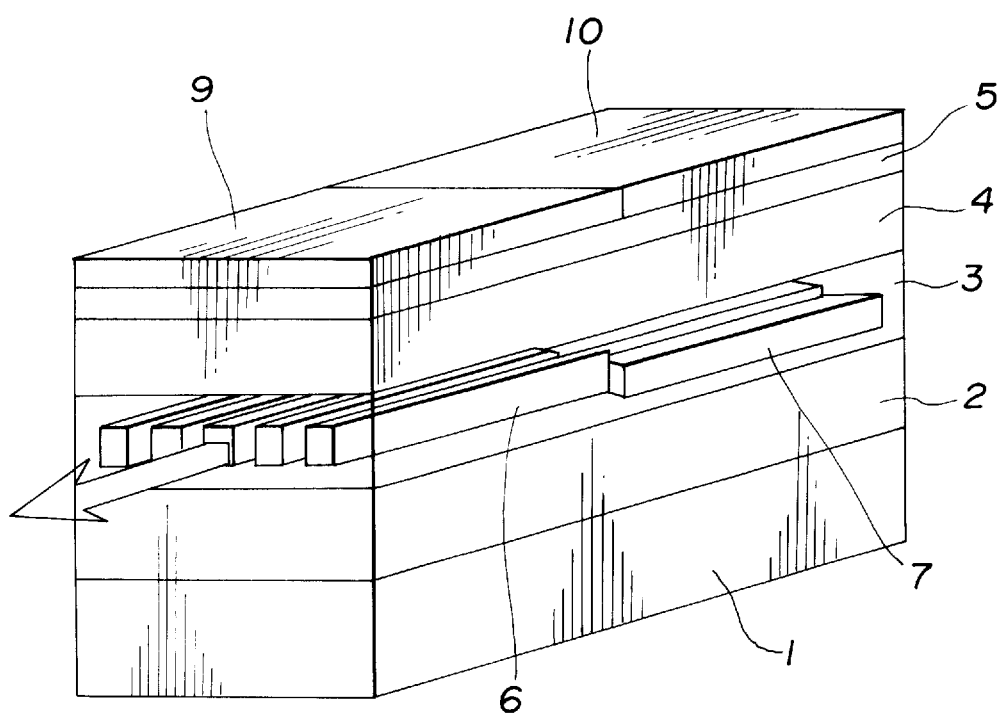
FIG. 2 is a perspective view illustrating an optical semiconductor device of a first model constructed in accordance with the present invention.

In a first model of a device of the present invention, a plurality of regions, where different kinds of quantum wires having different values of $L_y/L_z$ are respectively formed, are serially arranged in a cavity direction. The respective regions are respectively likely to stimulate light waves in the TE mode and the TM mode, and the polarization mode of laser light emitted from the device is controlled by changing the gains in the respective regions. FIG. 2 illustrates an example of the first model. The device is comprised of an n-type InP substrate 1, an n-type InP buffer layers 2, InGaAs quantum wires 6 and 7 surrounded by an InGaAsP light guide layer 3, a p-type InP clad layer 4, a p$^+$-InGaAs contact layer 5, a front electrode 9 and a rear electrode 10. The InGaAs quantum wires 6 and 7 are formed by an appropriate method, such as a crystal growth method using a grating (described below) and a patterning method using electron beam lithography or wet etching, and those quantum wires 6 and 7 are buried in the InGaAsP layer 3. Each quantum wire is oriented in parallel with a laser stripe. The $L_y/L_z$ ratio of the quantum wire 6 is set to 0.5 to attain emission in the TM mode, and $L_y$ and $L_z$ are respectively 20 nm and 40 nm. In contrast, the $L_y/L_z$ ratio of the quantum wire 7 is set to 2 to achieve emission in the TE mode, and $L_y$ and $L_z$ are respectively 40 nm and 20 nm.

Current is injected through the electrodes 9 and 10 corresponding to the quantum wire regions 6 and 7 to select the emission in the TE mode or the TM mode. When the current injected through the electrode 9 is increased, the TM mode becomes dominant. As the current injected through the electrode 10 is increased, the TE mode becomes dominant. When the oscillation mode is to be actually modulated, the current injected through one of the electrodes 9 and 10 is fixed at an appropriate value and the current injected through the other of the electrodes 9 and 10 is modulated. Thus, the oscillation polarization mode is changed while the oscillation wavelength remains unchanged. The present invention may also be applied to optical semiconductor devices, such as a semiconductor laser and an amplifier, comprised of material of AlGaAs, AlGaInP, ZnSe or the like, in addition to a device of InP series.

First Embodiment

Figure 3:
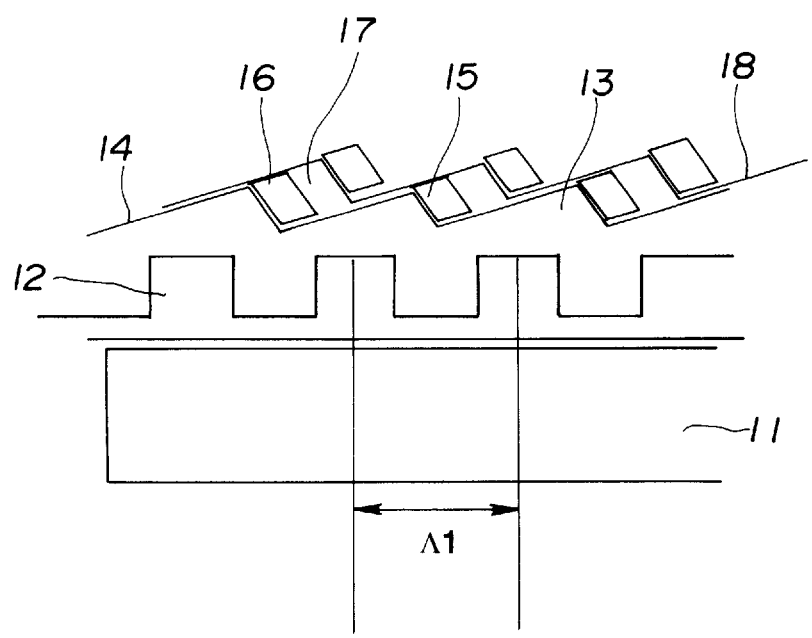
FIG. 3 is a cross-sectional view illustrating the shape of a quantum wire formed on a rectangular grating used in a first embodiment of the present invention.
Figure 4:
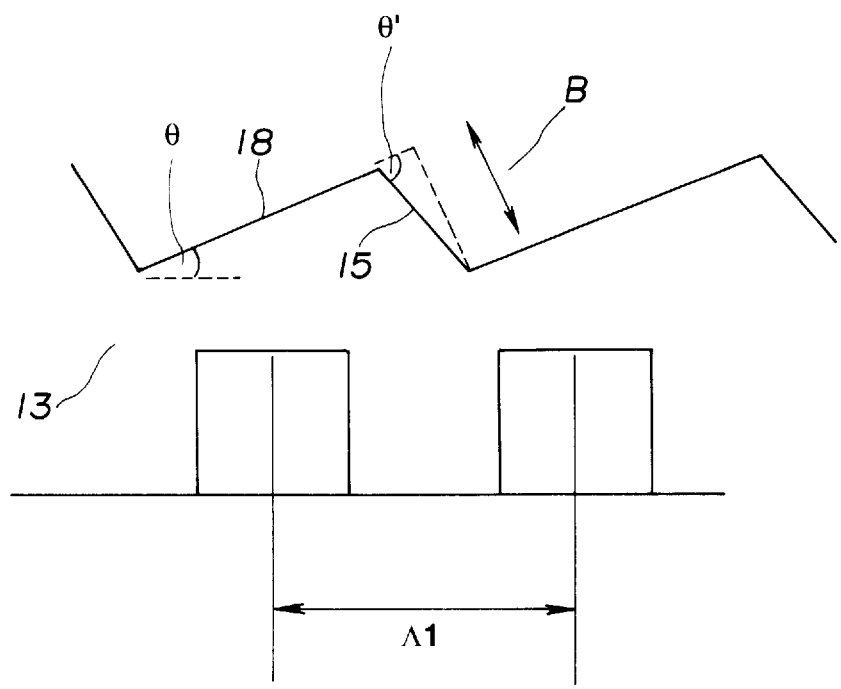
FIG. 4 is a cross-sectional view illustrating the shape of a quantum wire formed on a rectangular grating.

A first embodiment of the present invention will be described with reference to FIGS. 3 through 5. This embodiment belongs to the above-discussed first model. In the first embodiment, quantum wires having different cross sections are fabricated using a grating having a cross section of a rectangular shape.

A basic concept of this embodiment will be described with reference to FIGS. 3 and 4. As shown in FIG. 3, a grating 12 having a pitch $\Lambda_1$ is formed on a semiconductor substrate 11 which has a surface orientation inclined by 5 degrees (this degree may be in a range between 0 and 20 degrees) from a semiconductor {111} surface and which has a zinc-blende structure. As a fabrication method, interference exposure method and dry etching are used. In FIG. 3, reference numeral 12 is the grating or a periodical structure with a pitch of 120 nm fabricated by the interference exposure method. This pitch is determined from the integration density of the quantum wires.

In this embodiment, the grating 12 having the rectangular shape, in which the height can be readily regulated and predetermined surface orientations are exposed, is used. On the periodical structure 12, a semiconductor layer 13 is grown by a molecular beam epitaxy (MBE) method using a solid source, a gas source molecular beam epitaxy (GSMBE) method in which a part of molecular beam sources is a gas source, or a chemical beam epitaxy (CBM) method in which all of molecular beam sources are gas sources.

At this time, a growth condition, under which the growth speed on a {111} flat surface 18 is smaller than the growth speed on a {100} slant surface 15, is selected. The combination of the {111} terrace surface 18 and the {100} or {113} step surface 15 is suitable for that growth condition which can create such a growth speed difference. Thus, a saw-tooth shape 14 is formed. On this saw-tooth shape 14, a semiconductor layer 16, whose material is different from that of the semiconductor layer 13, is grown under the same condition. As a result, the semiconductor layer 16 is concentrated on the step portion 15. On the semiconductor layer 16, a semiconductor layer 17, whose material is different from that of the semiconductor layer 16, is grown. By repeating such a growth process, regions of different compositions are partly formed.

As described above, an important factor of this embodiment is that the growth speeds are different on those surfaces. When the length of a side of the layer 16 formed on the step surface 15 is approximately a size which can create a quantum effect (say, below 50 nm) and can be readily controlled, the semiconductor region can be partly confined readily in a quantum wire form. The semiconductor crystal can be grown by MOCVD, MOVPE, OMVPE method or the like as well as the above-described solid source MBE, GSMBE, MOMBE, or CBE method.

The size of the quantum wire formed as the semiconductor layer 16 will be described. The length of the semiconductor layer 16 needs to be less than 50 nm to attain the quantum effect. The size of this portion 16 is determined by the pitch $\Lambda_1$ of the grating 12 and a slant angle θ (described below) from the (111) surface, as illustrated in FIG. 4. An example will be described. FIG. 4 illustrates a portion of FIG. 3 in an expanded form. Here, the pitch $\Lambda_1$ is set to 120 nm. When the layer 13 is formed by the epitaxial method, a width B of the step (100) surface is determined by a relation:

$$B = \Lambda_1 \cdot \sin \theta / \sin \theta'$$

where θ is a slant angle of the substrate from the {111} surface, and θ' is an angle formed between the {111} surface and the step surface (for example, a (100) surface) and in this case equal to 54.7 degrees. If the slant angle 0 of the substrate 11 is set to about 5 degrees, the width B of the step (100) surface becomes 12 nm. Crystal is grown thereon by the epitaxial growth. For example, when a GaAs layer is grown on GaAs material using MBE method, the ratio between the growth speed on the (100) surface and the growth speed on the (111) surface is about 3 and the growth speed on the (100) surface 15 is three times larger than that on the (111) surface 18. As shown in FIG. 3, the quantum wire is formed on the step portion 15. The layer deposition is readily performed by changing supplied material.

Different kinds of gratings having different pitches are formed in a cavity direction of a semiconductor laser, so that quantum wires having different cross sections can be formed thereon. Thus, a semiconductor laser is accomplished, in which oscillation switching between the TE mode and the TM mode can be performed by changing a ratio between currents injected into the regions having the different quantum wires.

Figure 5:
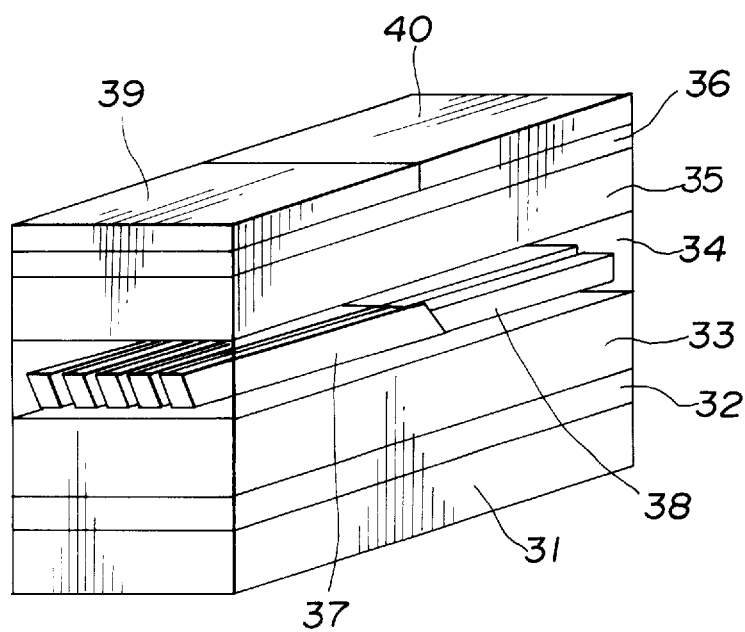
FIG. 5 is a perspective view illustrating an optical semiconductor device in which a substrate with a {111} surface is employed and quantum wires are formed using a rectangular grating.

FIG. 5 illustrates a semiconductor laser of this embodiment in which different quantum wires having different cross sections are arranged in the cavity direction. An n-type GaAs substrate 31 is used. A surface of the substrate 31 is inclined from a {111} surface toward a <110>direction about a <110>axis. On the substrate 31, an Sn-doped GaAs buffer layer 32 (its thickness: 0.5 μm), an Sn-doped AlGaAs clad layer 33 (its thickness: 1.5 μm), and quantum wires 37 and 38 confined within an undoped AlGaAs light guide layer 34 are formed. Then, a Be-doped AlGaAs upper light guide layer 35 (its thickness: 1.5 μm), a Be-doped GaAs contact layer 36 (its thickness: 0.5 μm) and electrodes 39 and 40 are formed.

Figure 6A:
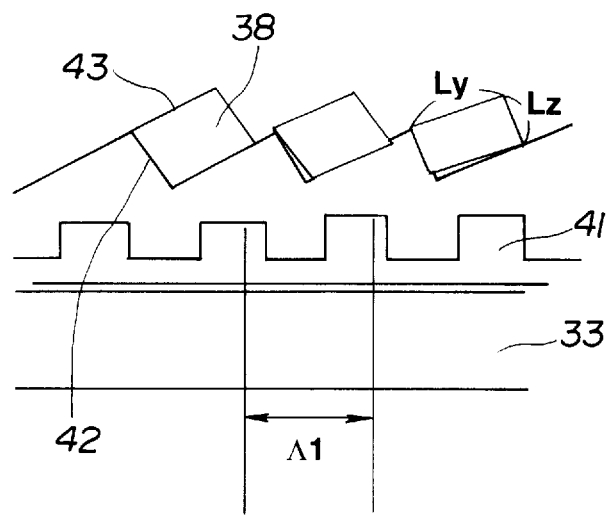
FIGS. 6A and 6B are respectively cross sectional views illustrating the shapes of quantum wires formed in front and rear regions of a first embodiment.

Shapes of cross sections of the quantum wires 37 and 38 will be described. FIG. 6A illustrates the cross section of the quantum wire 38 extending along the cavity direction in a rear region of the device. The pitch $\Lambda_1$, of a grating 41, which is formed on the clad layer 33 in the rear region and on which the quantum wires 38 are formed, is 150 nm. Therefore, it is known from the above-discussed relationship that a length 42 of a step portion of a saw-tooth structure formed on the grating 41 becomes 15 nm.

Figure 6B:
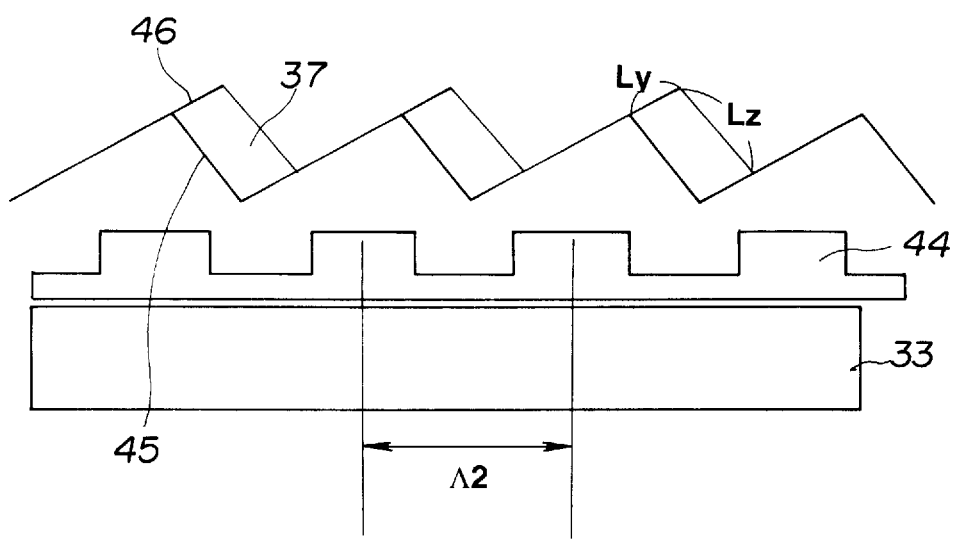

On the other hand, FIG. 6B illustrates the cross section of the quantum wire 37 in a front region from which laser light is emitted. The pitch $\Lambda_2$ of a grating 44, which is formed on the clad layer 33 in the front region and on which the quantum wires 37 are formed, is 300 nm. Therefore, a length 45 of a step portion of a saw-tooth structure formed on the grating 44 becomes 30 nm. Here, when the device is formed such that a length 43 of a semiconductor portion or the quantum wire 38 illustrated in FIG. 6A becomes 30 nm, a length 46 of the quantum wire 37 illustrated in FIG. 6B becomes 15 nm. As a result, the $L_y/L_z$ ratio of the quantum wire 37 in the front region becomes 0.5 since the lengths 45 ($L_z$) and 46 ($L_y$) have the above values. Thus, the gain for the TM mode is larger than that for the TE mode in the front region.

On the other hand, the $L_y/L_z$ ratio of the quantum wire 38 in the rear region becomes 2 since the lengths 42 ($L_z$) and 43 ($L_y$) have the above values. Thus, the gain for the TE mode is larger than that for the TM mode in the rear region. In the laser illustrated in FIG. 5 in which the quantum wires 37 and 38 respectively have the structures as illustrated in FIGS. 6A and 6B, the oscillation polarization mode can be switched between the TE mode and the TM mode by changing the ratio of currents injected through the electrodes 39 and 40.

Second Embodiment

Figure 7:
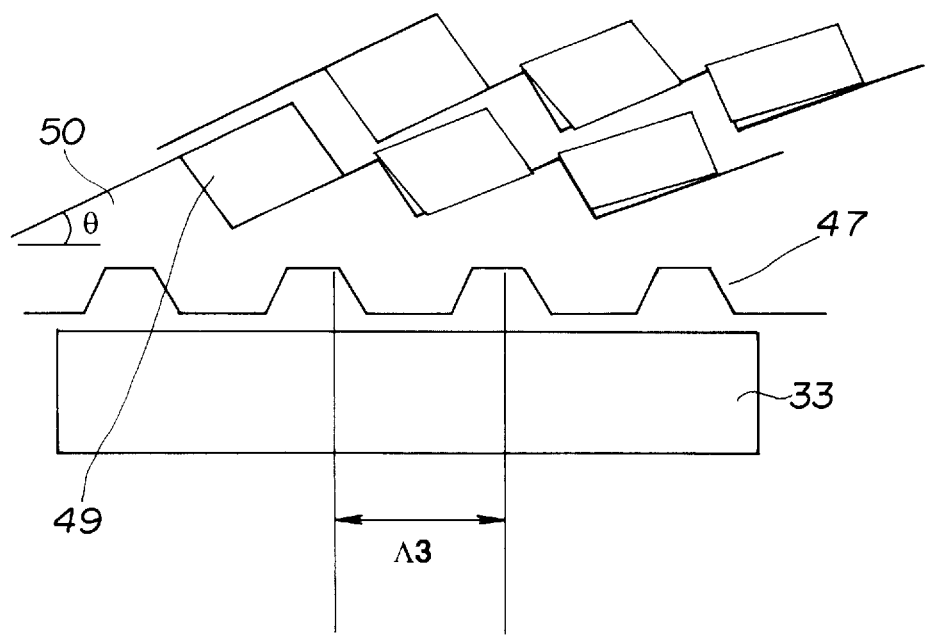
FIG. 7 is a cross-sectional view illustrating the shape of a quantum wire formed on a trapezoidal grating used in a second embodiment of the present invention.

A second embodiment of the present invention will be described with reference to FIG. 7. In the second embodiment, the cross section of a grating 47 is trapezoid. Also in a case of the trapezoid grating 47 having a pitch $\Lambda_3$, the number of orientations of exposed surfaces is small and its height can be readily regulated, similar to the rectangular grating. Thus, a well-controllable saw-tooth structure 50 can be formed on the trapezoid grating 47, and it is possible to fabricate quantum wires 49 as illustrated in FIG. 7. Other reference numbers correspond to the same features as the first embodiment.

Third Embodiment

Figure 8A:
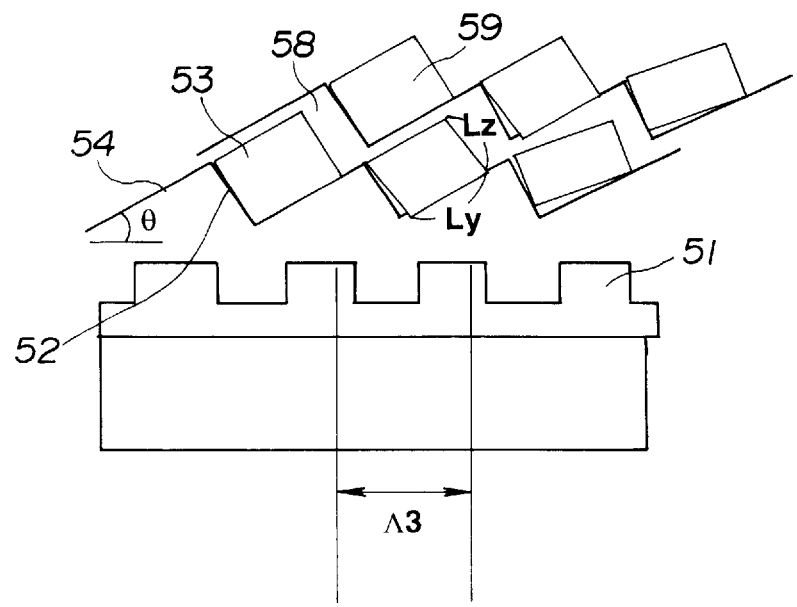
FIGS. 8A and 8B are respectively cross-sectional views illustrating the shapes of quantum wires formed in front and rear regions of a third embodiment in which a substrate with a {110} surface is employed and quantum wires are formed using a rectangular grating.
Figure 8B:
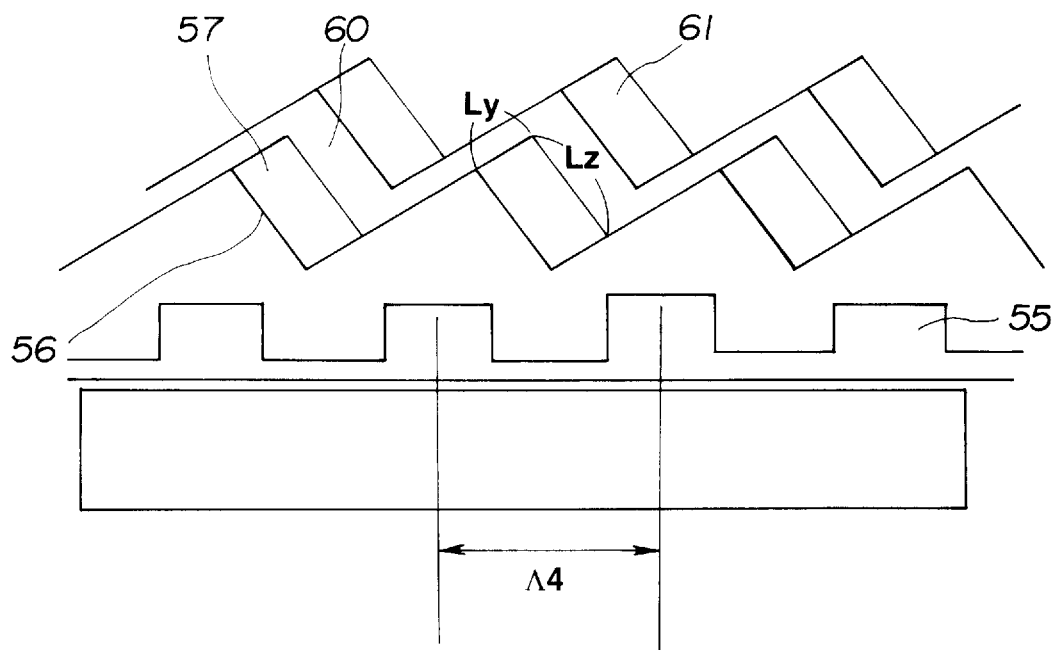

A third embodiment of the present invention will be described with reference to FIGS. 8A and 8B. In the third embodiment, a substrate, which has a {110} surface in place of a {111} surface, is used and the same effect as the first embodiment is achieved. In FIGS. 8A and 8B, the substrate is a semiconductor substrate which has a surface orientation inclined from the {110} surface by an angle θ falling in a range between 0 and 20 degrees. On the substrate, a rectangular grating 51 having a pitch $\Lambda_3$ is formed. Semiconductor crystal is grown on the grating 51, using MBE, GSMBE, MOMBE or CBE method. As a growth condition at this time, a condition is selected such that the growth speed on the {110} surface becomes slow. As a result, a saw-tooth structure, which has a {110} terrace surface 54 and a {100} or {113} or {114} step surface 52, can be formed.

The height or length of the step surface 52 illustrated in FIG. 8A depends on the pitch $\Lambda_3$ of the grating 51. Also in this structure, as a pitch $\Lambda_4$ of a grating 55 increases, the height of a step surface 56 becomes higher as illustrated in FIG. 8B. When semiconductor crystal is grown on the saw-tooth structures having different heights in front and rear regions, under a growth condition that the growth speed on terrace surfaces 54 is slow and the growth speed on the step surfaces 52 and 56 is high, the growth proceeds principally in a lateral direction (a y-direction), while the step shape is maintained and the surface configuration is maintained, or while at least the periodical structure on the surface is sustained. Thus, quantum wires 53 and 57 having different shapes as illustrated in FIGS. 8A and 8B can be respectively formed in front and rear regions. Here, when a ratio between gains for the TE mode and the TM mode is to be increased, a difference between the pitches of the gratings 51 and 55 only needs to be increased.

The quantum wires 53 and 57 having different shapes as illustrated in FIGS. 8A and 8B are respectively arranged in a cavity direction in the front and rear regions, and electrodes are formed such that the oscillation polarization mode can be switched between the TE mode and the TM mode by controlling currents injected through those electrodes.

FIGS. 8A and 8B illustrate structures in which quantum wires 53 and 59 and 57 and 61 are stacked. When the kind of supplied molecular beams is varied during the growth process, a second periodical structure including the second quantum wires 59 and 61 as illustrated in FIGS. 8A and 8B can be fabricated. To obtain a layer 58 illustrated in FIG. 8A, materials, which exhibit no difference in growth speed on the {110} surface and the {100} surface, are supplied, or a supply ratio between elements of V group and m group is changed. Here, AlGaAs, which contains much Al (this element would not migrate or move so much on the growth surface), is used. A modulation method of molecular beams, which changes materials between the layers 58 and 59, is generally performed, for example, by opening and closing a shutter, a valve or the like, which is usually used during fabrication of quantum wells. Modulation time is appropriately selected from times which are shorter than time needed for the step surface to be grown over the distances of $\Lambda_3$ and $\Lambda_4$, so that the pitch of the periodical structure can be made smaller (for example, an inverse number of an integer) than the grating pitches $\Lambda_3$ and $\Lambda_4$. Layers 58 and 60 are composed of AlGaAs and the layers 53, 57, 59 and 61 are composed of GaAs.

Other features of this embodiment are the same as the first embodiment.

Fourth Embodiment

A fourth embodiment will be described with reference to FIGS. 9 and 10. In this embodiment, the oscillation mode switching between the TE mode and the TM mode is effectively achieved by constricting current paths directed toward quantum wires in an active region.

The basic concept of this embodiment will be described. An element of Si acts as an amphoteric (n-type and p-type) impurity for III–V semiconductor compound. The polarity of Si becomes n-type when Si is placed in a Ga site of the III–V semiconductor compound, while the polarity of Si becomes p-type when Si is placed in an As site of the III–V semiconductor compound. In general, when Si-doped GaAs is grown on a {111}A surface, a p-type GaAs is obtained. In contrast, when Si-doped GaAs is grown on a {100} surface, an n-type GaAs is obtained. In this embodiment, current confinement is attained using those characteristics.

A method for injecting current into the quantum wires using those characteristics will be described. FIG. 9 shows layers around an active layer region of a semiconductor laser of this embodiment. A substrate, whose surface is inclined several degrees from the {111} surface, is used, and a p-type AlGaAs clad layer 71 is grown on the substrate. On the clad layer 71, a p-type AlGaAs grating 72 is formed. When Be-doped GaAs or AlGaAs 73 is grown thereon, the grating becomes like a saw-tooth structure. Here, the layer 73 is entirely p-type. The activation rate of p-type carriers in the layer 73 on the {100} step surface is larger than that on the {111}A terrace surface, so that resistance toward the step surface becomes small.

An undoped GaAs 74 is formed on the layer 73, and quantum wires 75 are formed on the step slant surface of the layer 73. Then, Sn-doped AlGaAs 76 is grown. Since Sn would not act as an amphoteric impurity like Si though Sn also belongs to IV group, the entire layer 76 is n-type. Thereafter, an Si-doped layer 77 is grown. As a result, a portion of the layer 77 on the (111) terrace surface 78 becomes p-type, and a portion 79 on the step surface becomes n-type. Further, Sn-doped AlGaAs 80 is grown.

As a result, the layers 76, 77 and 80 form an NPN junction in a region corresponding to the terrace slant portion 78 of the layer 77, and hence current 82 is blocked thereat. Further, the activation rate on the {100} surface corresponding to the step of the layer 74 is large, compared with that on the {111}A terrace surface, so that current is likely to concentrate into a portion corresponding to the {100} step surface. Consequently, current 81 flows along the step slant surface through the portion 79 on the step surface. Thus, it is possible to effectively supply currents to the quantum wires 75 from a predetermined direction.

Figure 10:
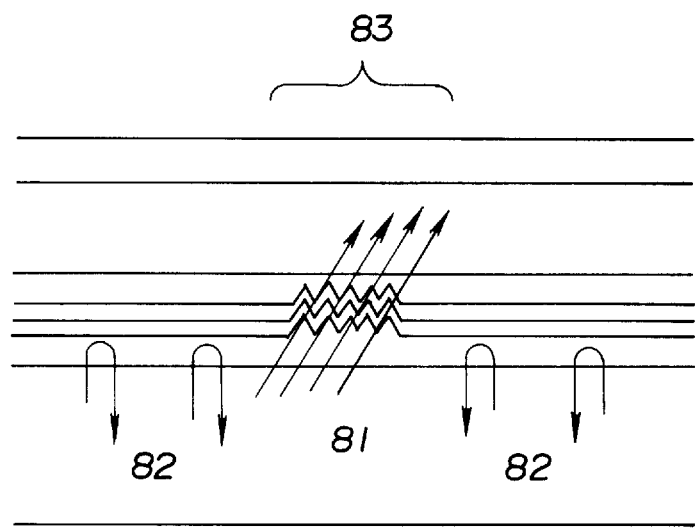
FIG. 10 is a cross-sectional view illustrating of a polarization mode selective laser in which a current confinement structure is formed.

When a grating is formed only in a portion corresponding to a laser current path region 83 as illustrated in FIG. 10, current is blocked and no current 82 flows in a flat region corresponding to the {111}A surface. Therefore, current 81 flows in the portion 83 where the grating is formed. In this method, the direction of current supply into the quantum wires is restricted by the above structure, and laser current is constrained into the current path. In this embodiment, the principle of polarization mode switching is the same as the above embodiments.

Fifth Embodiment

In a fifth embodiment, Si-doped GaAs and AlGaAs are p-type even on the {110} surface. A substrate inclined several degrees from a {110} is used. A {100} surface formed on a step portion is used to form an n-type portion thereon. This combination is used to achieve the same effect as the fourth embodiment.

Figure 9:
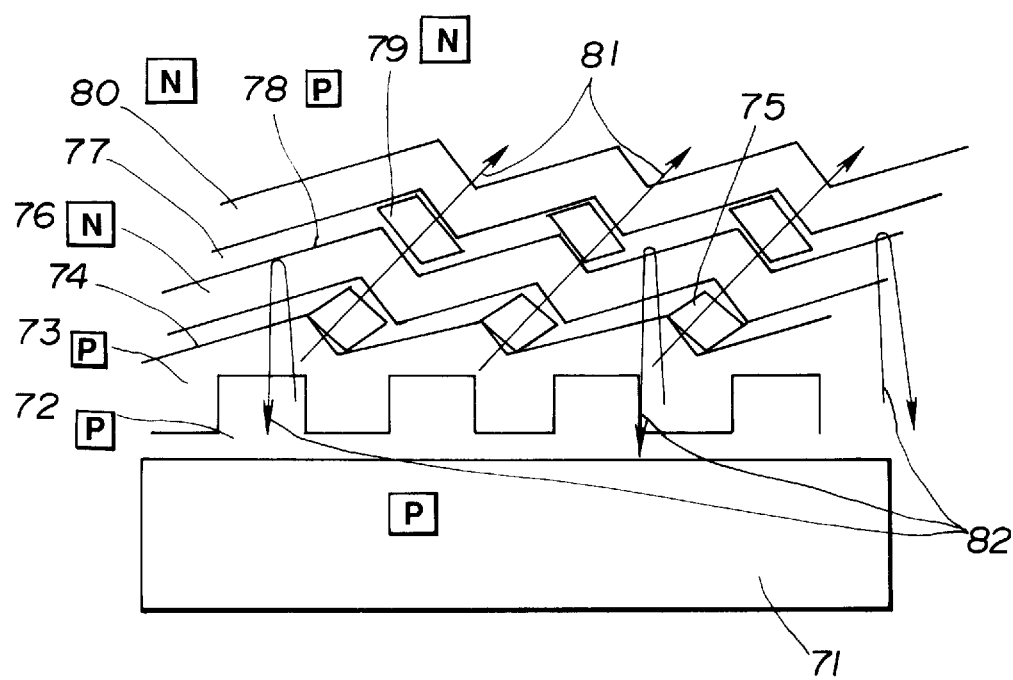
FIG. 9 is a cross-sectional view illustrating of a fourth embodiment of the present invention in which a current confinement structure is formed.

In other words, the {100} surface is formed on the step portion of the layer 73 only by replacing the substrate or the clad layer 71 illustrated in FIG. 9 with a substrate whose surface is inclined several degrees from the {110} surface. Thus, the same effect can be attained as a case where a substrate with the {111} surface is used. The fabrication of quantum wires on the {110} substrate is described in the third embodiment.

Sixth Embodiment

Figure 11:
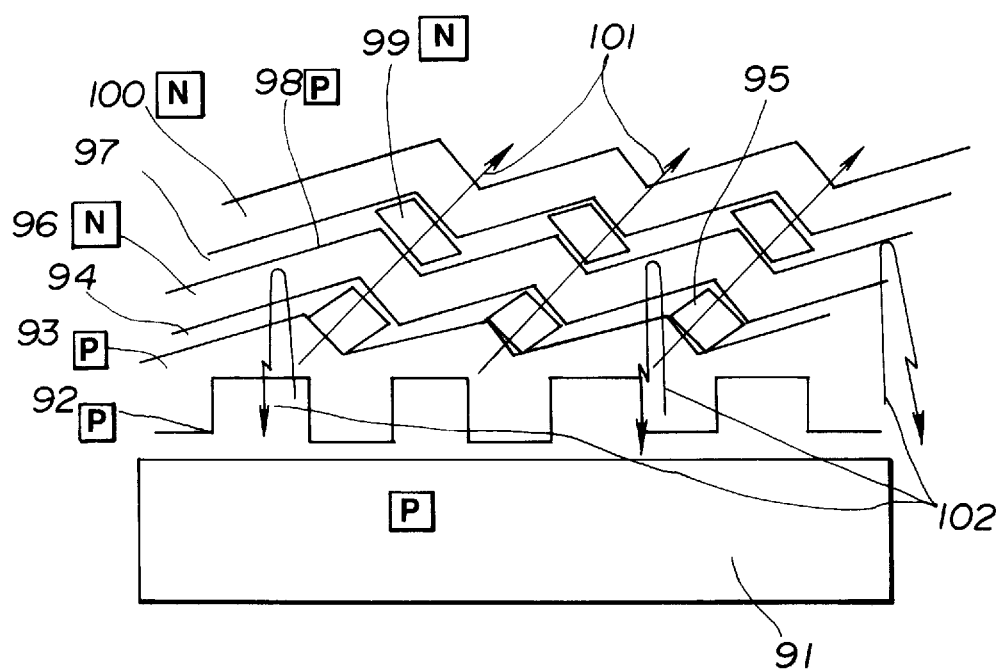
FIG. 11 is a cross-sectional view illustrating of a sixth embodiment of the present invention in which a current confinement structure is formed.

In a sixth embodiment, Zn and Se are used in place of the amphoteric impurity Si to form a P/N region on the grown surface. Thus, the same effect as the fourth embodiment is achieved. FIG. 11 illustrates layers around an active layer of a semiconductor laser of this embodiment.

As a growth method, MOVPE method is used. In FIG. 11, reference numeral 91 is a p-type AlGaInP clad layer which is doped with Zn. Reference numeral 92 is a p-type AlGaInP light guide layer in which a rectangular grating is formed as illustrated in FIG. 11. Reference numeral 93 is a light guide layer which is laid down to form a {111} terrace surface and a {100} step surface. After the {111} terrace surface and the {100} step surface are formed, an undoped GaInP active layer 94 is formed. Reference numeral 95 is a quantum wire which is formed on the {100} step surface. Reference numeral 96 is an n-type AlGaInP layer, which is doped with Se and is formed to construct current restraint layers together with layers 97 and 100. Thereon, the AlGaInP layer 97, which is simultaneously doped with both of Se and Zn, is formed. When the simultaneous doping is conducted, the layer 97 on the {111} terrace surface becomes a p-type portion 98 and the layer 97 on the {100} step surface becomes an n-type portion 99. Reference numeral 100 is also an Se-doped n-type AlGaInP layer.

As a result, a current 101 flows through a portion corresponding to the {100} step surface. At a portion corresponding to the {111} terrace surface, current 102 is blocked. Thus, the same structure as the fourth embodiment is obtained by a gas growth series method, such as MOVPE method. As a dopant material, DMZn and H$_2$Se are used. Also in this embodiment, the structure of quantum wires and the operation principle of oscillation mode switching between the TE mode and the TM mode are the same as those of the above embodiments.

Seventh Embodiment

A seventh embodiment is directed to an optical amplifier. The laser devices described in the above embodiments can be used also as an optical amplifier by depositing a low reflective film, such as an SiO$_2$/ZrO film, on end facets of the device. Further, when current is selectively or appropriately supplied into the TE region and the TM region having different quantum wires (the current is set below an oscillation threshold), the device can be used as a mode selective type optical amplifier which amplifies light in a predetermined polarization mode, a polarization-insensitive optical amplifier which can evenly amplifies light in all the polarization modes, or the like.

Eighth Embodiment

Figure 12:
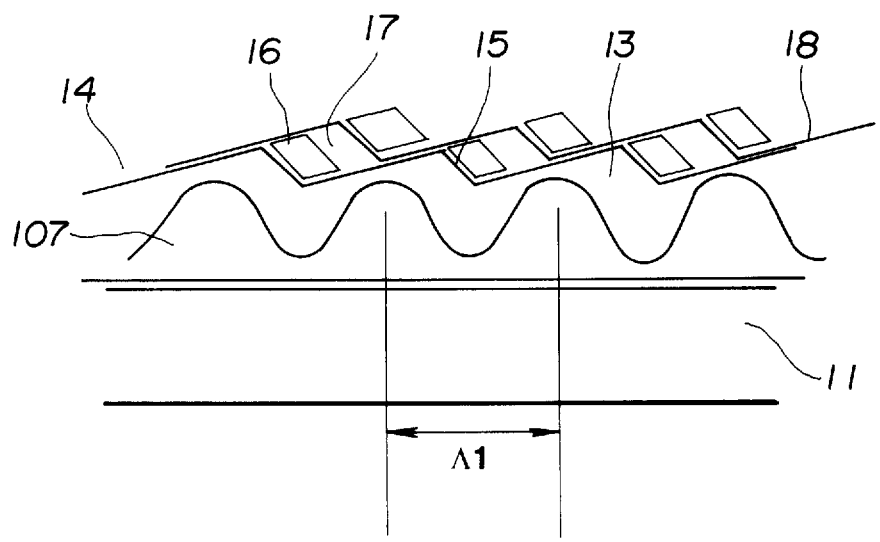
FIG. 12 is a cross sectional view illustrating of an eighth embodiment of the present invention in which a quantum wire is formed using a grating having a sinusoidal cross section.

In the embodiments described above, the rectangular or trapezoidal grating can be replaced by a grating 107 having a sinusoidal cross section as illustrated in FIG. 12. FIG. 12 corresponds to FIG. 3, and the same reference numerals designate portions having the same functions.

Other features of this embodiment are the same as those of the above-described embodiments. The sinusoidal grating of this embodiment can also be applied to embodiments described below.

Ninth Embodiment

A ninth embodiment will be described with reference to FIGS. 13 and 14. This embodiment features a spacer layer provided between two regions in which a plurality of quantum wires are respectively formed in a cavity direction. Accordingly, the scattering occurring at the boundary between the two regions of different quantum wires can be reduced.

Figure 13:
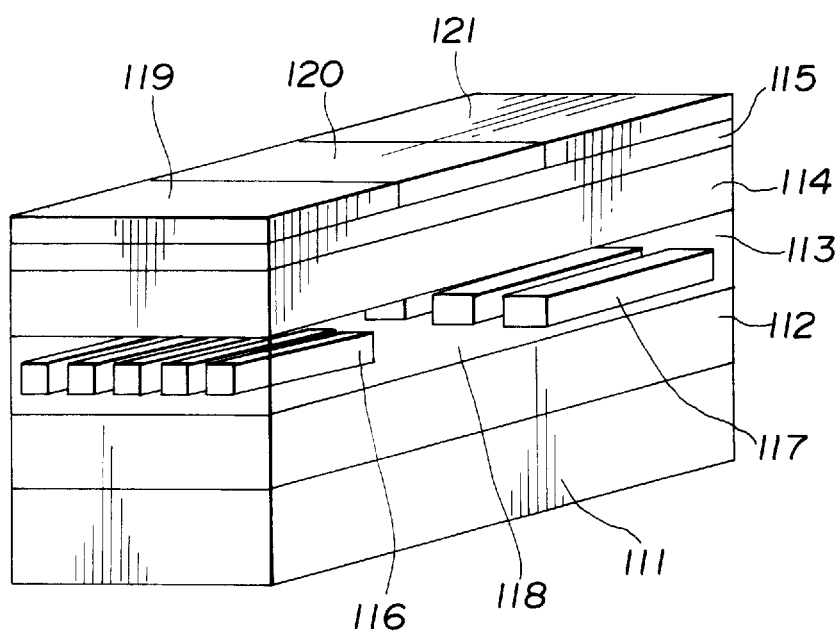
FIG. 13 is a perspective view illustrating an optical semiconductor device of a ninth embodiment which has a spacer region.
Figure 14:
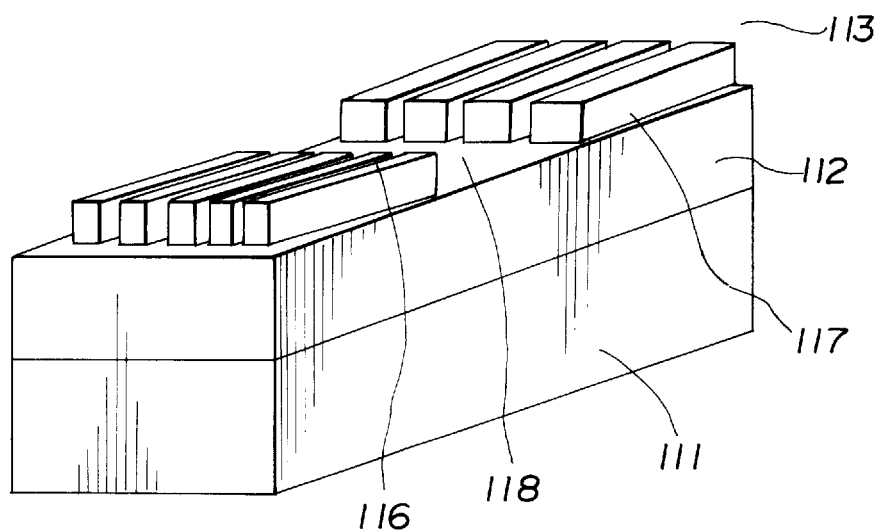
FIG. 14 is a perspective view illustrating a method for fabricating a ninth embodiment which has a spacer region.

In FIG. 13, reference numeral 111 is an n-type GaAs substrate which has a surface inclined several degrees from a {111} surface. Reference numeral 112 is an AlGaAs clad layer. Reference numeral 113 is a light guide layer which contains different kinds of quantum wires. Reference numeral 114 is an upper clad layer. Reference numeral 115 is a contact layer. Reference numerals 116 and 117 are quantum wires which respectively have different cross sections. As a result, the oscillation polarization mode switching between the TE mode and the TM mode is made possible. In this embodiment, there is arranged a spacer region 118 between the two regions of the different quantum wires 116 and 117.

It is likely that an interference region may be formed between the two different quantum wires when the two regions of the different quantum wires 116 and 117 are fabricated. Light scattering occurs in the interference region and adverse effect may occur to laser characteristics. Therefore, the spacer region 118 is formed between the two regions of the different quantum wires 116 and 117 to prevent that adverse effect.

The spacer region 118 can be formed as follows: A transition region is removed by etching after forming the different quantum wires 116 and 117 as illustrated in FIG. 14, for example. Thereafter, re-growth is conducted as illustrated in FIG. 13, and thus the laser structure is fabricated. Reference numerals 119, 120 and 121 are electrodes for the front quantum wires 116, phase control, and the rear quantum wires 117, respectively. The structures of the quantum wires 116 and 117 and the operation principle of TE/TM mode switching are the same as those of the above embodiments.

Tenth Embodiment

A tenth embodiment will be described with reference to FIG. 15. This embodiment has a diffraction grating for oscillation wavelength selection. A diffraction grating 134 functions as a distributed feedback reflector for light in a propagation mode, and hence a dynamic single mode laser can be achieved.

Figure 15:
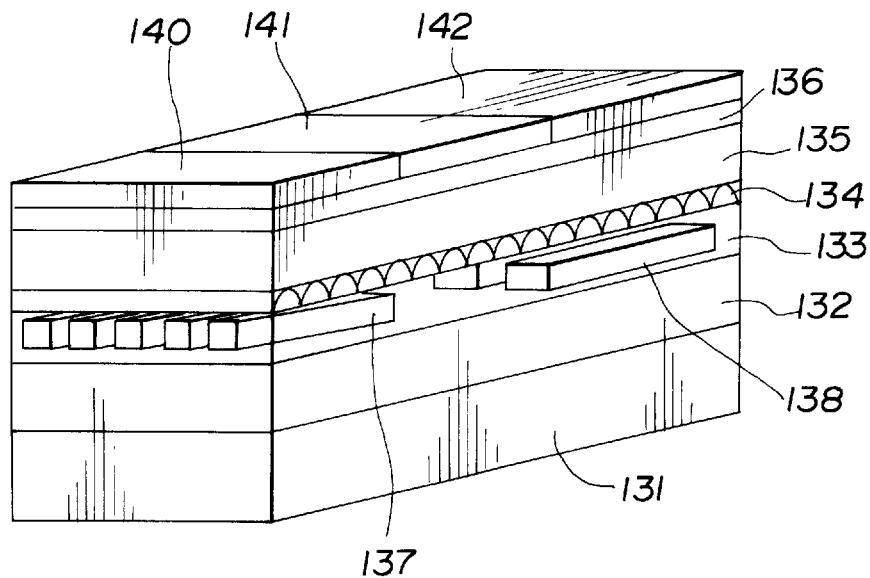
FIG. 15 is a perspective view illustrating an optical semiconductor device of a tenth embodiment which has a diffraction grating for wavelength selection.

In FIG. 15, reference numeral 131 is an n-type GaAs substrate which has a surface inclined several degrees from a {111} surface. Reference numeral 132 is an AlGaAs clad layer. Reference numeral 133 is a light guide layer which contains different kinds of quantum wires. Reference numeral 135 is an upper clad layer. Reference numeral 136 is a contact layer. Reference numerals 137 and 138 are quantum wires which respectively have different cross sections. As a result, the oscillation polarization mode switching between the TE mode and the TM mode is made possible.

This embodiment features a grating 134 for wavelength selection. The grating 134 is made by stopping growth after the growth up to the light guide layer 133 and forming the grating 134 by interference exposure method. Its pitch is 240 nm. Thereafter, the upper clad layer 135 and the contact layer 136 are laid down. Thus, a dynamic single mode laser is fabricated. The TE/TM polarization modulation is controlled by amounts of currents injected through electrodes 140 and 142. A central electrode 141 acts to control the phase.

Eleventh Embodiment

In the first model of a device of the present invention, a plurality of regions with different kinds of quantum wires are serially arranged in a cavity direction. The above-discussed embodiments all relate to this first model. An eleventh embodiment and the following embodiments are, however, directed to a second model different from the first model.

The basic concept of the second model will be described with reference to FIGS. 16A–16D. In the second model, there are arranged a first region in which gains for the TE mode and the TM mode are approximately equal to each other, or one of those gains is slightly more dominant than the other, and a second region in which said the other gain is more dominant. Further, quantum wires discussed in FIGS. 1A–1C are provided in at least one of the regions. Thus, a semiconductor laser, an optical amplifier and the like can be obtained. The oscillation polarization mode can be switched by a small change in current, and a semiconductor laser having an oscillation spectrum with a narrow half width can be attained. Further, the burden of a driver electric circuit for driving the device can be reduced.

The eleventh embodiment will be described.

Figure 16A:
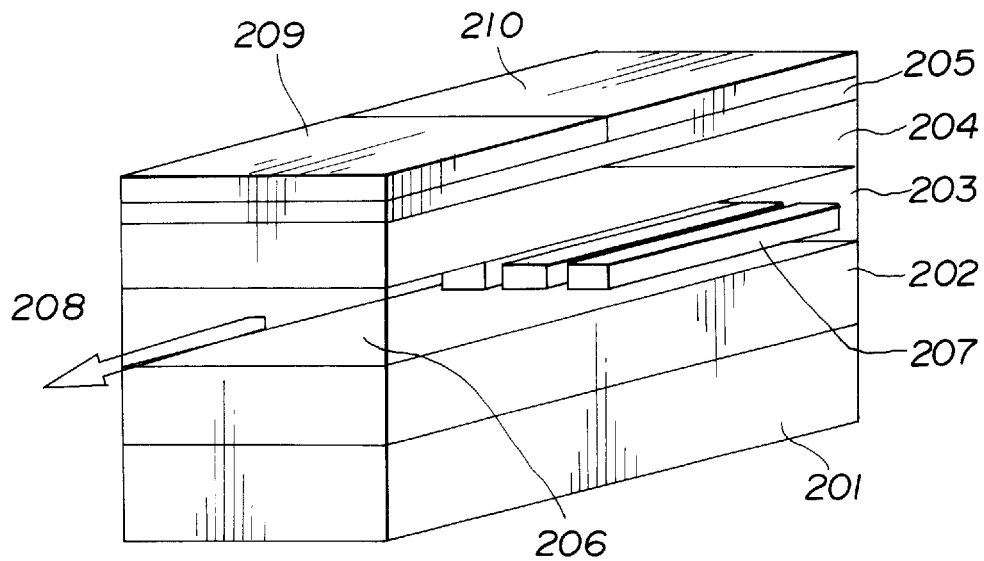
FIG. 16A is a perspective view illustrating an optical semiconductor device of an eleventh embodiment which relates to a second model constructed in accordance with the present invention.
Figure 16B:
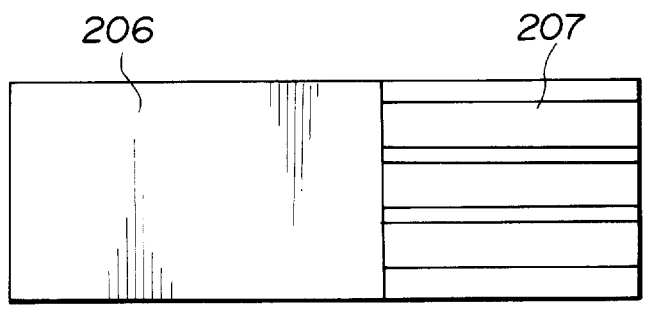
FIG. 16B is a plan view of FIG. 16A.

As illustrated in FIG. 16A, an Si-doped InP buffer layer 202 (its thickness: 1.5 $\mu$m), an undoped active area 203, a Be-doped InP upper clad layer 204 (its thickness: 1.5 $\mu$m) and a Be-doped InGaAs cap layer 205 (its thickness: 0.5 $\mu$m) are laid down on an n-type InP substrate 201. The active area 203 has two regions as discussed above. In a first region, gains for the TE mode and the TM mode are made about equal to each other. In the first region, an ordinary undoped InGaAsP bulk active layer 206 is used. Its thickness is 0.1 $\mu$m and its oscillation wavelength is set to 1.5 $\mu$m. In the first region, although the gains for the two modes are made about equal, the TE mode becomes dominant at the time of oscillation. Serially to the first region, another region is provided. In a second region, quantum wires 207 of undoped InGaAs are provided and those quantum wires 207 are surrounded by an undoped InGaAsP barrier. Its oscillation wavelength is set to 1.5 $\mu$m, and the TM mode is made dominant. Those two regions with the bulk active layer 206 and the quantum wires 207 are arranged serially as illustrated in FIG. 16B.

Further, in FIG. 16A, reference numeral 208 is an emission direction of laser light, reference numeral 209 is an electrode for injecting current into the first region with the bulk active layer 206 having about the same gains for the TE mode and the TM mode, and reference numeral 210 is an electrode for injecting current into the second region with the quantum wires 207 having the dominant gain for the TM mode.

Figure 16C:
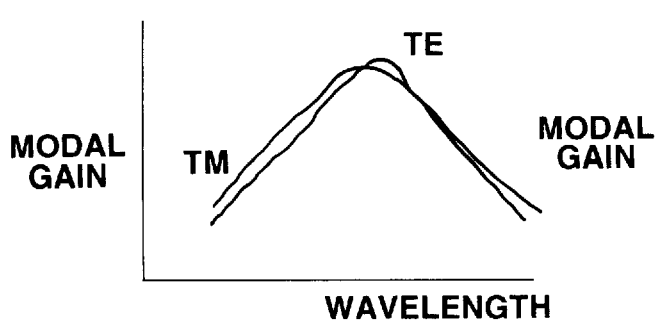
FIGS. 16C and 16D respectively illustrate wavelength dispersions of gains for the TE mode and the TM mode in front and rear regions of an eleventh embodiment.
Figure 16D:
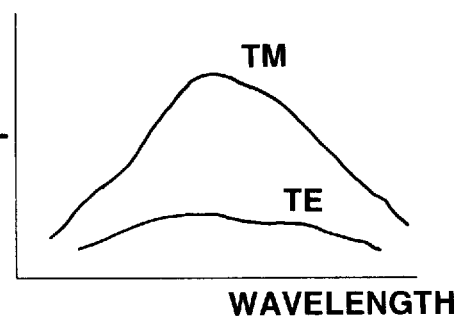

FIG. 16C illustrates wavelength dispersions of gains for the TE mode and the TM mode in the bulk active layer 206. The ordinate indicates the modal gain and the abscissa designates the wavelength. It can be known therefrom that the bulk layer 206 gains for the same gains for the TE mode and the TM mode. FIG. 16D illustrates wavelength dispersions of gains for the TE mode and the TM mode in the quantum wire region 207, which shows that the gain for the TM mode is dominant.

The driving method of the eleventh embodiment will be described. When the laser is to be oscillated in the TE mode, carriers are supplied to the quantum wire region 207 to such a degree that the region 207 would not act as an absorptive region and, at the same time, carriers (current) needed for oscillation are supplied to the bulk active layer region 206. When the oscillation mode of the laser in this state is to be changed to the TM mode, carriers injected into the quantum wire region 207 only needs to be slightly changed. At this time, since the bulk region 206 already has not only the gain for the TE mode also the gain for the TM mode, the oscillation in the TE mode will be changed to the oscillation in the TM mode upon a slight increase in the gain for the TM mode in the quantum wire region 207.

As described above, a polarization mode selective laser can be accomplished, in which the oscillation mode can be stably changed and controlled by a small change in carriers.

In this embodiment, the quantum wires 207 can be formed by the method as described in the above embodiments.

Twelfth Embodiment

A twelfth embodiment has a feature that a region having about the same gains for the TE mode and the TM mode is constructed by quantum wires. Due to characteristics of the quantum wires, the gain ratio between gains for the TE mode and the TM mode can be precisely regulated. The structure of the twelfth embodiment, such as a semiconductor laser and an optical amplifier, will be described with reference to FIG. 17A.

Figure 17A:
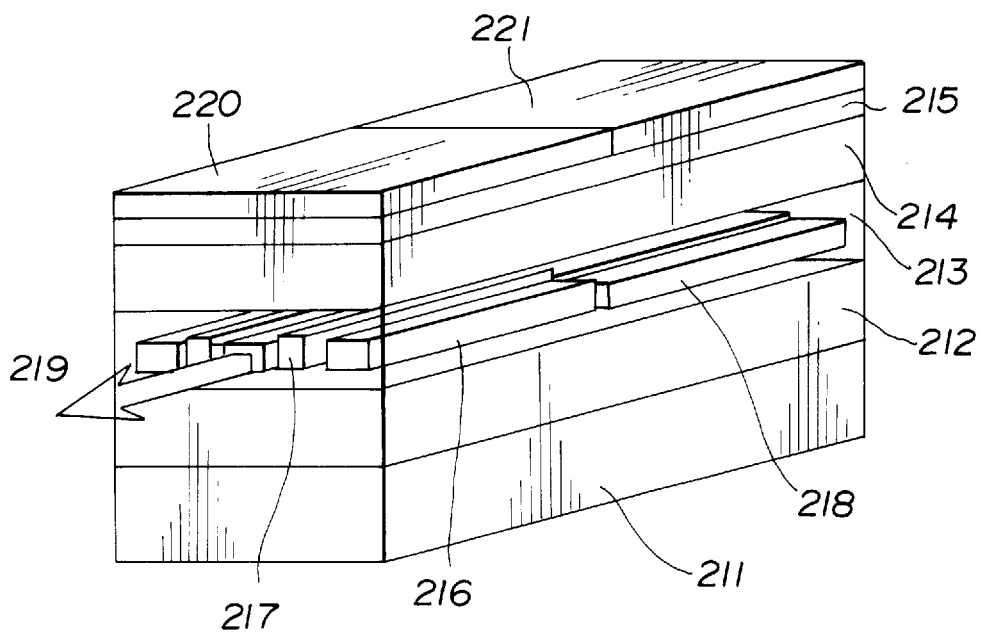
FIG. 17A is a perspective view illustrating an optical semiconductor device of a twelfth embodiment of the present invention.

As illustrated in FIG. 17A, an Si-doped InP buffer layer 212 (its thickness is 1.5 $\mu$m), an undoped active area 213, a Be-doped InP upper clad layer 214 (its thickness is 1.5 $\mu$m) and a Be-doped InGaAs cap layer 215 (its thickness is 0.5 $\mu$m) are laid down on an n-type InP substrate 211. The active area 213 has two regions as discussed above. In a first region, gains for the TE mode and the TM mode are made about equal to each other. The first region is composed of two kinds of quantum wires 216 and 217 having different cross sections. The quantum wire 216 has the gain for the TE mode which is adjusted to be larger than that for the TM mode. The quantum wire 217 has the gain for the TM mode which is larger than that for the TE mode. Here, the gain of the quantum wire 217 is made larger than that of the quantum wire 216 such that the gain for the TM mode becomes slightly dominant as illustrated in FIG. 17B.

Serially to the first region, another region, whose gain for the TE mode is larger than that for the TM mode, is formed. The second region is composed of quantum wires 218. The quantum wire 218 has the gain for the TE mode which is considerably larger than that for the TM mode.

Further, in FIG. 17A, reference numeral 219 is an emission direction of laser light, reference numeral 220 is an electrode for injecting current into the first region with the quantum wires 216 and 217 therethrough, and reference numeral 221 is an electrode for injecting current into the second region with the quantum wires 218 therethrough. Those quantum wires 216, 217 and 218 are respectively composed of undoped InGaAs and surrounded by undoped InGaAsP barriers. Oscillation wavelengths thereof are all set to 1.5 $\mu$m.

Figure 17B:
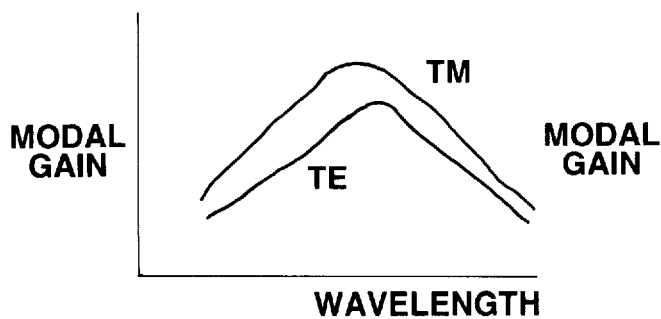
FIGS. 17B and 17C respectively illustrate wavelength dispersions of gains for the TE mode and the TM mode in front and rear regions of a twelfth embodiment.
Figure 17C:
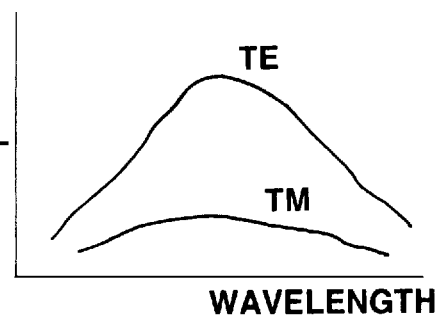

FIG. 17B illustrates gain profiles for the TE mode and the TM mode in the first active region constructed by the quantum wires 216 and 217. FIG. 17C illustrates gain profiles for the TE mode and the TM mode in the second active region constructed by the quantum wires 218.

In this structure, when the laser oscillation in the TM mode is to be attained, current is injected such that oscillation in the first region with the quantum wires 216 and 217 becomes dominant. When the oscillation in the TE mode is to take place, current injected into the second region with the quantum wires 218 is slightly increased such that the gain for the TE mode in the first region is complemented. Thus, the oscillation polarization mode is switched or modulated by a small change in current or carriers, so that the oscillation spectral width of the laser can be narrowed. In this embodiment, since the first region is composed of two different kinds of quantum wires 216 and 217, the gain ratio between gains for the TE mode and the TM mode can be readily and precisely controlled by shapes of the quantum wires 216 and 217 and the like.

Thirteenth Embodiment

A thirteenth embodiment has a feature that there are arranged a region where the gain for the TE mode is dominant, a region where the gain for the TM mode is dominant and a region where the gain for the TE mode is approximately equal to that for the TM mode. The structure of the thirteenth embodiment, such as a semiconductor laser and an optical amplifier, will be described with reference to FIG. 18.

Figure 18:
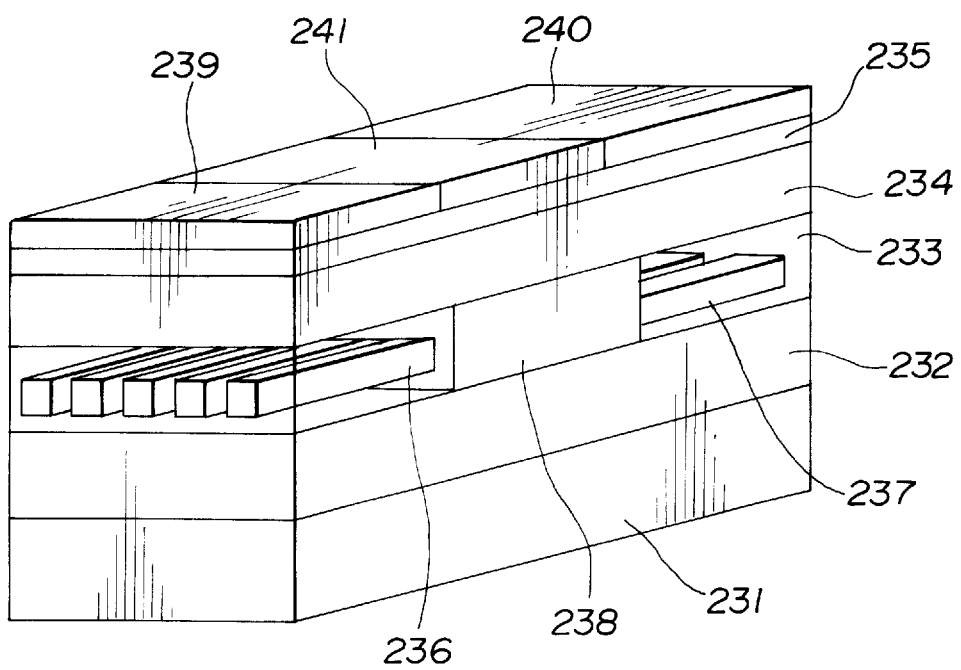
FIG. 18 is a perspective view illustrating an optical semiconductor device of a thirteenth embodiment of the present invention which has three active regions.

As illustrated in FIG. 18, an Si-doped InP buffer layer 232 (its thickness is 1.5 μm), an undoped active area 233, a Be-doped InP upper clad layer 234 (its thickness is 1.5 μm) and a Be-doped InGaAs cap layer 235 (its thickness is 0.5 μm) are laid down on an n-type InP substrate 231.

The active area 233 has three regions as discussed above. In a first region, quantum wires 236 are formed such that the gain for the TM mode is dominant. In a second region, quantum wires 237 are formed such that the gain for the TE mode is dominant. In a third central region, the gain for the TM mode is adjusted to be about equal to that for the TE mode. Here, an ordinary undoped InGaAsP bulk active layer 238 is used. Its thickness is 0.1 μm, and its oscillation wavelength is set to 1.5 μm.

Further, in FIG. 18, reference numeral 239 is an electrode for injecting current or carriers into the quantum wires 236 in the first region therethrough, reference numeral 240 is an electrode for injecting current into the quantum wires 237 in the second region therethrough, and reference numeral 241 is an electrode for injecting current or carriers into the active layer 238 in the third region therethrough.

In the laser of this embodiment, gains for the TE mode and the TM mode are raised near its laser oscillation threshold by current injected into the TE/TM gain region 238 with the active layer 238, and the gains for the TE mode and the TM mode are varied by a small change in carriers injected into the TM mode dominant region 236 or the TE mode dominant region 237. A modulation current may be injected into one of the regions 236 and 237, or modulation current having mutually-inverse phases may be injected into the respective regions 236 and 237. Also in this embodiment, the oscillation mode switching between the TE mode and the TM mode can be performed by a small change in carriers, so that the laser can have a narrow oscillation spectrum. Further, the oscillation mode switching can be conducted still more stably since the gain regions are respectively provided for the TE mode and the TM mode in addition to the TE/TM gain region in which the gain for the TM mode is adjusted to be about equal to that for the TE mode.

Fourteenth Embodiment

A fourteenth embodiment features that a wavelength selecting means is added to the structure of the thirteenth embodiment. The structure of the fourteenth embodiment will be described with reference to FIG. 19.

Figure 19:
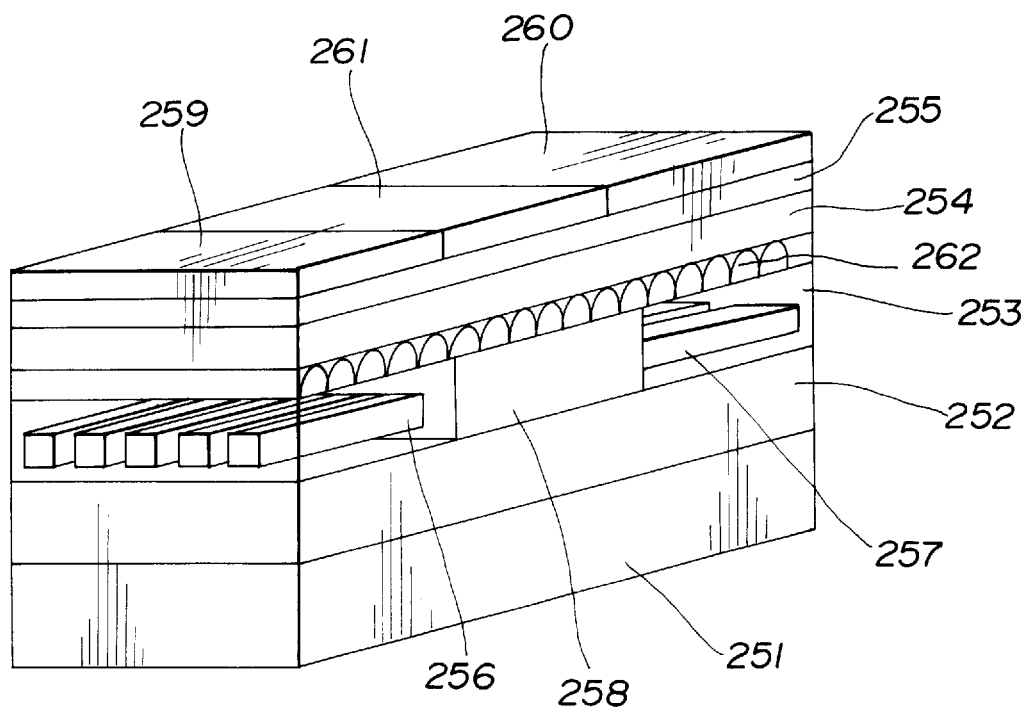
FIG. 19 is a perspective view illustrating an optical semiconductor device of a fourteenth embodiment which has a diffraction grating for wavelength selection.

As illustrated in FIG. 19, a Be-doped InP clad layer 252 (its thickness is 2.0 μm), an undoped active area 253, an Si-doped InP upper clad layer 254 (its thickness is 2.0 μm) and an Si-doped InGaAs cap layer 255 (its thickness is 0.5 μm) are laid down on a p-type InP substrate 251.

The active area 253 has three regions as discussed above. In a first region, quantum wires 256 are formed such that the gain for the TM mode is dominant. In a second region, quantum wires 257 are formed such that the gain for the TE mode is dominant. In a third central region, the gain for the TM mode is about equal to that for the TE mode. Here, an ordinary undoped InGaAsP bulk active layer 258 is used. Its thickness is 0.1 μm, and its oscillation wavelength is set to 1.55 μm.

Further, in FIG. 18, reference numeral 259 is an electrode for injecting current or carriers into the quantum wires 256 in the first region therethrough, reference numeral 260 is an electrode for injecting current into the quantum wires 257 in the second region therethrough, and reference numeral 261 is an electrode for injecting current or carriers into the active layer 258 in the third central region therethrough.

In this embodiment, a grating 262 is provided to determine the laser oscillation wavelength. The grating 262 is formed by the interference exposure method using a He—Cd laser. Its pitch is 240 nm. Due to the presence of the grating 392, the oscillation wavelength is fixed to 1.538 μm and the oscillation mode switching between the TE mode and the TM mode is performed by injecting carriers into the quantum wire regions 256 and 257. Thus, wavelength-stabilized polarization mode selective laser is established.

In the region 258 where the gains for the TE mode and the TM mode are approximately equal to each other, other layers than the bulk active layer can be used. The above-discussed quantum wires, quantum box or the like can be used as well.

In FIG. 19, the electrodes 259, 260 and 261 are illustrated as connected with each other, but actually those electrodes are separated from each other. Considering expansion of injected current, it is desirable to remove the entire cap layer 255 and part of the clad layer 254 between the electrodes 259, 260 and 261. As a result, crosstalk of the current is reduced, and stabilities of the oscillation polarization modes (the TE mode and the TM mode), output power and the like are improved. The separation of the electrodes are also important in the above embodiments.

The oscillation wavelength selecting means can also be provided in the above embodiments. In the above embodiments, the phase control region may be provided and a plurality of electrodes may be formed. Thus, the oscillation wavelength can be tuned by controlling currents injected through the electrodes.

Also in the eleventh to fourteenth embodiments directed to the above-discussed second model, the method for fabricating the quantum wires and the method for forming the current confinement structure described with reference to FIGS. 3, 4, 9 and so forth can be used.

Fifteenth Embodiment

Figure 20:
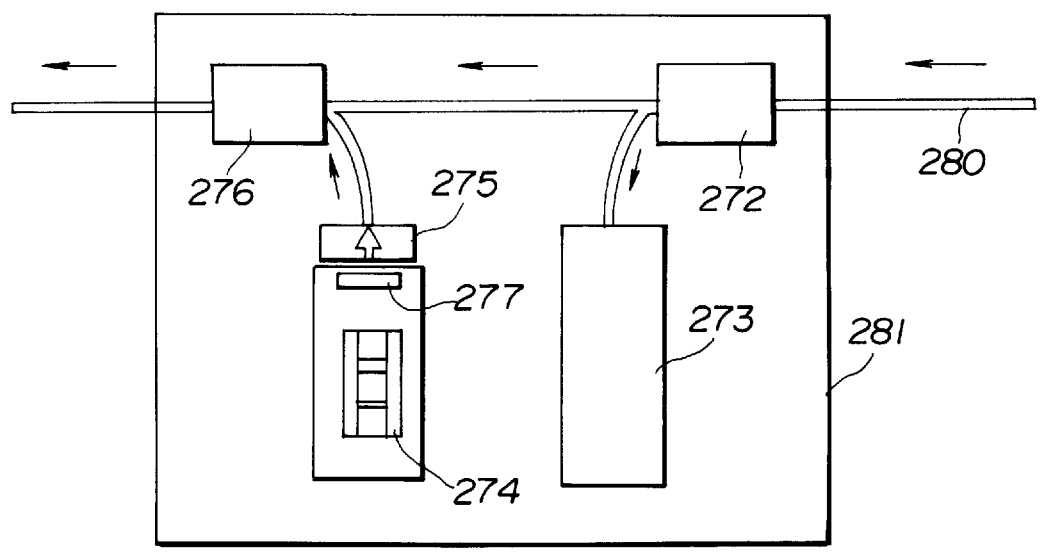
FIG. 20 is a block diagram illustrating the structure of a node using an optical semiconductor device of the present invention.

A fifteenth embodiment will now be described with reference to FIGS. 20 and 21. The fifteenth embodiment is directed to an optical local area network (LAN) system or a wavelength division multiplexing optical LAN system using an optical semiconductor device of the present invention as a light source in a transmitter, for example. FIG. 20 illustrates an opto-electric converting unit (node), which is connected to a terminal of the optical LAN system shown in FIG. 21.

Figure 21:
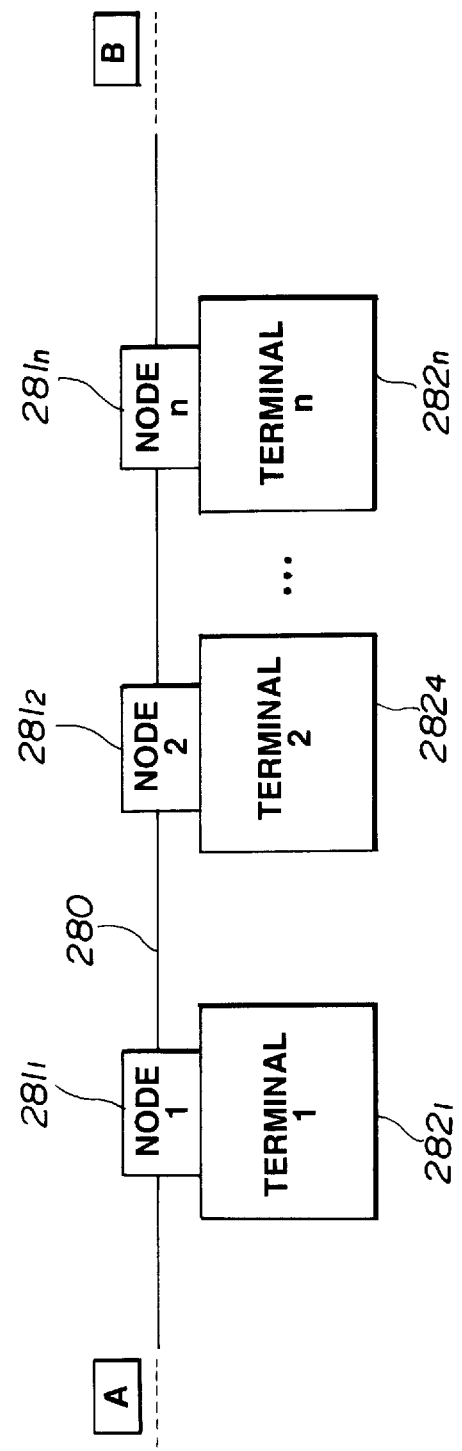
FIG. 21 is a block diagram illustrating the structure of an optical LAN system using an optical semiconductor device of the present invention.

In the bus-type network shown in FIG. 21, multiple terminals $282_1, 282_2, \ldots, 282_n$ are respectively connected to an optical fiber 280 through nodes $281_1, 281_2, \ldots, 281_n$ along a direction A-B.

In FIG. 20, a light signal is taken into the node 281 through the optical fiber 280, and a portion of the signal is input into an optical receiver 273 by a branching device 272. The optical receiver 273 includes a tunable optical filter and a photodetector, and only signal light at a selected wavelength is taken out from the incident signal light, and the signal is detected.

On the other hand, when a light signal is transmitted from the node 281, signal light from an optical semiconductor device 274 of the present invention is input into the optical fiber 280 at a combining portion 276 through an isolator 275. The laser 274 is driven by a method described in the above embodiments, and a polarization-modulated light wave emitted from the laser 274 is converted to an intensity-modulated light output by a polarizer 277 or the like.

A plurality of tunable optical filters and semiconductor lasers may be arranged in a node to widen the wavelength tunable range. Further, two nodes may be connected to each terminal and two optical fibers may be provided to accomplish bi-directional transmission of a DQDB system.

As a network, a loop type, which is constructed by connecting A and B in FIG. 21, a star type, or a compound configuration thereof may be used.

Sixteenth Embodiment

Figure 22:
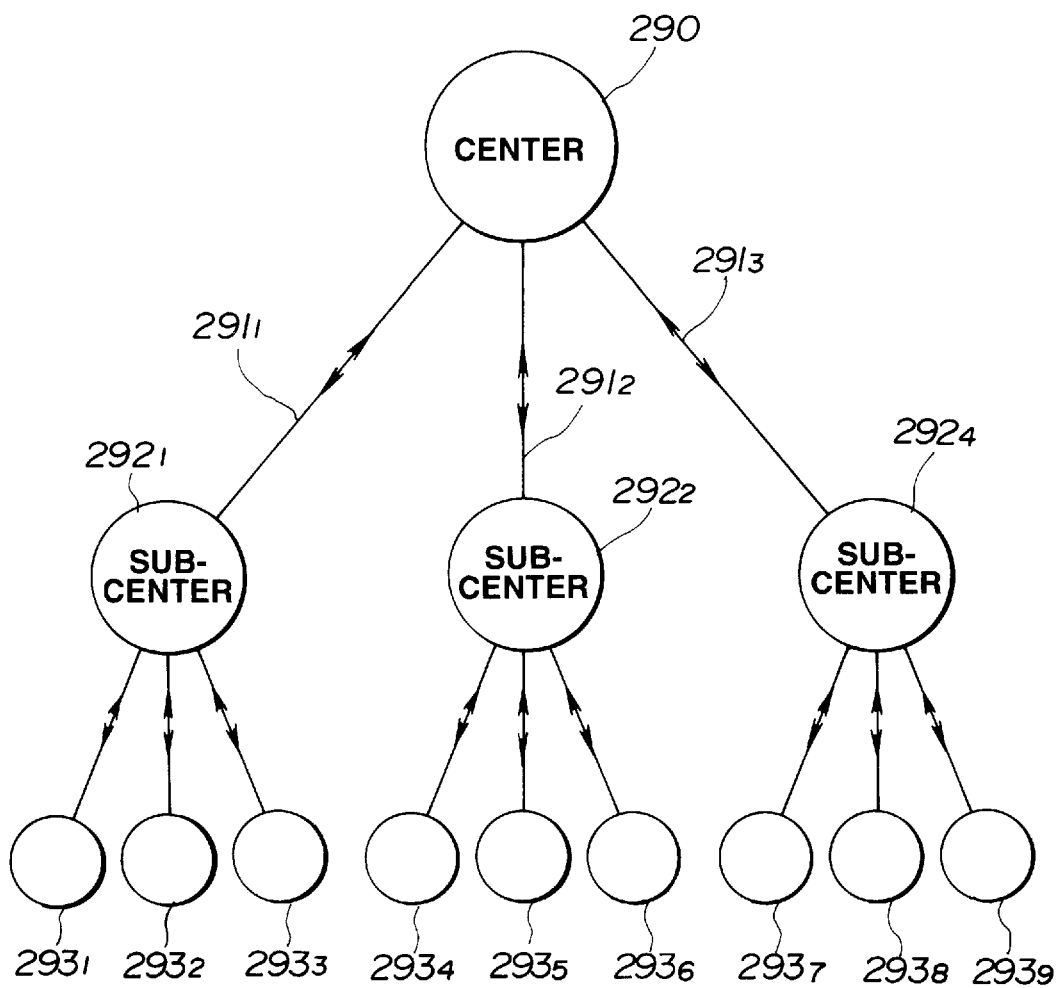
FIG. 22 is a block diagram illustrating the structure of a bi-directional optical CATV system using an optical semiconductor device of the present invention.

A bi-directional optical CATV system, as shown in FIG. 22, can be constructed using a semiconductor device and an optical communication system of the present invention. In FIG. 22, reference numeral 290 is a CATV center, reference numerals $292_1, 292_2$ and $292_3$ are respectively sub-centers connected to the center 290 by optical fibers $291_1, 291_2$ and $291_3$, and reference numerals $293_1, 293_2, \ldots, 293_9$ are respectively receivers of subscribers connected to the sub-centers $292_1, 292_2$ and $292_3$. In the center 290, a light source apparatus or tunable laser is polarization-modulated by a driving method described in the above embodiments, and a plurality of video signals are carried on signal light of different wavelengths to transmit the signals to the receivers $293_1, 293_2, \ldots, 293_9$. Each receiver includes a tunable wavelength filter and a photodetector, and only signal light at a desired wavelength of input signal light is detected to reproduce a picture image on a monitor. On the subscriber side, the transmission wavelength of the tunable filter is changed to select a desired channel. Thus, a desired picture image can be obtained. Conventionally, it was difficult to use such a DFB filter in that system due to the dynamic wavelength fluctuation of a DFB laser. The present invention enables the use of such a DFB filter.

Further, a bi-directional CATV is possible in the following manner. Each of the receivers $293_1, 293_2, \ldots, 293_9$, has an external modulator (an example of a simple bi-directional optical CATV, see, for example, Ishikawa and Furuta "LiNbO$_3$ Optical Wavelength Modulator For Bi-directional Transmission in Optical CATV Subscriber Systems", OCS 91–82 1991), and a signal from the subscriber is received as a reflected light (reflected light of a signal light transmitted to the subscriber) from its external modulator. Thus, highly improved services can be obtained.

Except as otherwise disclosed herein, the various components shown in outline or block form in any of the FIGS. 1–22 are individually well known in the optical semiconductor device and optical communication arts, and their internal construction and operation are not described herein.

While the present invention has been described with respect to what are presently considered to be the preferred embodiments, it is to be understood that the invention is not limited to the disclosed embodiments. The present invention is intended to cover various modifications and equivalent arrangements included within the spirit and scope of the appended claims.

What is claimed is:

1. An optical semiconductor device comprising:
   a semiconductor substrate;
   a first region formed on said substrate, said first region including a first active layer;
   a second region formed on said substrate, said second region including a second active layer, at least one of said first active layer and said second active layer containing quantum wires which extend in a cavity direction; and
   stimulating means for stimulating said first active layer and said second active layer independently from each other.

2. An optical semiconductor device according to claim 1, wherein said first active layer and said second active layer respectively contain different kinds of quantum wires having different cross sections.

3. An optical semiconductor device according to claim 1, wherein at least one of said first active layer and said second active layer contain different kinds of quantum wires having different cross sections.

4. An optical semiconductor device according to claim 1, wherein said quantum wires are formed on a grating.

5. An optical semiconductor device according to claim 4, wherein said grating has a rectangular cross section.

6. An optical semiconductor device according to claim 4, wherein said grating has a trapezoidal cross section.

7. An optical semiconductor device according to claim 4, wherein said substrate comprises a substrate having a surface whose orientation is inclined from a {111} surface by an angle in a range from 0 to 20 degrees, and said grating is formed on said substrate.

8. An optical semiconductor device according to claim 7, further comprising current confining means for confining a current, which is injected by said stimulating means, toward said quantum wire, said current confining means including a layer doped with an amphoteric impurity and grown on said grating.

9. An optical semiconductor device according to claim 8, wherein an amphoteric impurity is Si.

10. An optical semiconductor device according to claim 7, further comprising current confining means for confining a current, which is injected by said stimulating means, toward said quantum wire, said current confining means including a layer simultaneously doped with Zn and Se and grown on said grating.

11. An optical semiconductor device according to claim 4, wherein said substrate comprises a substrate having a surface whose orientation is inclined from a {110} surface by an angle in a range from 0 to 20 degrees, and said grating is formed on said substrate.

12. An optical semiconductor device according to claim 11, further comprising current confining means for confining a current, which is injected by said stimulating means, toward said quantum wire, said current confining means including a layer doped with an amphoteric impurity and grown on said grating.

13. An optical semiconductor device according to claim 12, wherein an amphoteric impurity is Si.

14. An optical semiconductor device according to claim 11, further comprising current confining means for confining a current, which is injected by said stimulating means, toward said quantum wire, said current confining means including a layer simultaneously doped with Zn and Se and grown on said grating.

15. An optical semiconductor device according to claim 1, further comprising a spacer region for reducing scattering occurring between said first active layer and said second active layer, said spacer region being interposed between said first active layer and said second active layer.

16. An optical semiconductor device according to claim 1, further comprising a diffraction grating for selecting an oscillation wavelength of said device.

17. An optical semiconductor device according to claim 1, wherein said first active layer is constructed such that a gain for a first mode of two polarization modes is approximately equal to or slightly larger than a gain for a second mode of two polarization modes, said second active layer is constructed such that a gain for the second mode is larger than a gain for the first mode and said second active layer contains said quantum wires.

18. An optical semiconductor device according to claim 17, wherein said first active layer contains different kinds of quantum wires having different cross sections.

19. An optical semiconductor device according to claim 17, wherein said first active layer comprises a bulk active layer.

20. An optical semiconductor device according to claim 17, further comprising a third region, said third region including a third active layer, and wherein said third active layer is constructed such that a gain for the first mode is larger than a gain for the second mode and said third active layer contains quantum wires.

21. An optical semiconductor device according to claim 17, wherein the first mode is a transverse electric mode and the second mode is a transverse magnetic mode.

22. An optical semiconductor device according to claim 1, wherein said device is constructed such that a polarization mode of oscillation light therefrom can be switched between a transverse electric mode and a transverse magnetic mode.

23. An optical semiconductor device according to claim 1, further comprising a low reflective film provided on an end facet of said device and wherein said device is constructed so as to function as an optical amplifier.

24. An optical semiconductor device according to claim 1, wherein said first active layer and said second active layer respectively contain different kinds of quantum wires having different cross section, and one of said quantum wires is constructed such that a gain for a fist mode of two polarization modes is larger than a gain for a second mode of two polarization modes, and the other of said quantum wires is constructed such that a gain for said second mode of two polarization modes is larger than a gain for said first mode of two polarization modes.

25. An optical communication system for communicating over a light transmission line that transmits signals from a transmitter side to a receiver side, said system comprising:

a light source, said light source including a semiconductor laser which includes a semiconductor substrate, a first region with a first active layer formed on the substrate, a second region with a second active layer formed on said substrate, and in which at least one of said first active layer and said second active layer contains quantum wires extending in a cavity direction and a polarization mode of oscillation light from said semiconductor laser is switched between two different polarization modes by injecting a current including a modulation current into at least one of said first active layer and said second active layer of said semiconductor laser; and polarization mode selecting means for selecting light in one of the two different polarization modes emitted from said semiconductor laser;

coupling means for coupling light in one of the two different polarization modes from said semiconductor laser to the light transmission line; and a receiver for detecting the light in one of the two different polarization modes transmitted through the light transmission line, said receiver being disposed on the receiver side.

26. An optical communication system according to claim 25, wherein said quantum wires are formed on a grating.

27. An optical communication system according to claim 26, wherein said grating has a rectangular cross section.

28. An optical communication system according to claim 26, wherein said grating has a trapezoidal cross section.

29. An optical communication system according to claim 25, wherein said first active layer is constructed such that a gain for a first mode of the two polarization modes is approximately equal to or slightly larger than a gain for a second mode of the two polarization modes, said second active layer is constructed such that a gain for the second mode is larger than a gain for he fist mode and said second active layer contains said quantum wires.

30. An opto-electric converting apparatus, said apparatus comprising:

a light source, said light source including a semiconductor laser which includes a semiconductor substrate, a first region with a first active layer formed on said substrate, a second region with a second active layer formed on said substrate, and in which at least one of said first active layer and said second active layer contains quantum wires extending in a cavity direction and a polarization mode of oscillation light from said semiconductor laser is switched between two different polarization modes by injecting a current including a modulation current into at least one of said first active layer and said second active layer of said semiconductor laser; and polarization mode selecting means for selecting light in one of the two different polarization modes emitted from said semiconductor laser;

coupling means for coupling light in one of the two different polarization modes from said semiconductor laser to a light transmission line; and a receiver for detecting the light in one of the two different polarization modes transmitted through the light transmission line.

31. An opto-electric converting apparatus according to claim 30, wherein said quantum wires are formed on a grating.

32. An opto-electric converting apparatus according to claim 31, wherein said grating has a rectangular cross section.

33. An opto-electric converting apparatus according to claim 31, wherein said grating has a trapezoidal cross section.

34. An opto-electric converting apparatus according to claim 30, wherein said first active layer is constructed such that a gain for a first mode of the two polarization modes is approximately equal to or slightly larger than a gain for a second mode of the two polarization modes, said second active layer is constructed such that a gain for the second mode is larger than a gain for the first mode and said second active layer contains said quantum wires.

35. A light source apparatus comprising:

a semiconductor laser which includes a semiconductor substrate, a first region with a first active layer formed on said substrate, a second region with a second active layer formed on said substrate, and in which at least one of said first active layer and said second active layer contains quantum wires extending in a cavity direction and a polarization mode of oscillation light from said semiconductor laser is switched between two different polarization modes by injecting a current including a modulation current into at least one of said first active layer and said second active layer of said semiconductor laser; and polarization mode selecting means for selecting light in one of the two different polarization modes emitted from said semiconductor laser.

36. A light source apparatus according to claim 35, wherein said quantum wires are formed on a grating.

37. A light source apparatus according to claim 36, wherein said grating has a rectangular cross section.

38. A light source apparatus according to claim 36, wherein said grating has a trapezoidal cross section.

39. A light source apparatus according to claim 35, wherein said first active layer is constructed such that a gain for a first mode of the two polarization modes is approximately equal to or slightly larger than a gain for a second mode of the two polarization modes, said second active layer is constructed such that a gain for the second mode is larger than a gain for the first mode and said second active layer contains said quantum wires.

40. An optical cable television system for communicating over a light transmission line that transmits a light signal from a broadcasting center to a subscriber side, said system comprising:

a light source, said light source including a semiconductor laser which includes a semiconductor substrate, a first region with a first active layer formed on the substrate, a second region with a second active layer formed on the substrate, and in which at least one of the first active layer and the second active layer contains quantum wires extending in a cavity direction and a polarization mode of oscillation light from said semiconductor laser is switched between two different polarization modes by injecting a current including a modulation current into at least one of the first active layer and the second active layer of said semiconductor laser; and polarization mode selecting means for selecting light in one of the two different polarization modes emitted from said semiconductor laser;

coupling means for coupling light in one of the two different polarization modes from said semiconductor laser to the light transmission line, said light source and said coupling means being disposed at the broadcasting center; and a receiver and an optical filter for detecting light in one of the two different polarization modes transmitted through the light transmission line, said receiver and said optical filter being disposed on the subscriber side.

41. An optical cable television system according to claim 40, wherein said quantum wires are formed on a grating.

42. An optical cable television system according to claim 41, wherein said grating has a rectangular cross section.

43. An optical cable television system according to claim 41, wherein said grating has a trapezoidal cross section.

44. An optical cable television system according to claim 40, wherein said first active layer is constructed such that a gain for a first mode of the two polarization modes is approximately equal to or slightly larger than a gain for a second mode of the two polarization modes, said second active layer is constructed such that a gain for the second mode is larger than a gain for the first mode and said second active layer contains said quantum wires.

45. An optical semiconductor device comprising:

a semiconductor substrate;

a first region formed on said substrate, said first region including a first active layer;

a second region formed on said substrate, second region including a second active layer, at least one of said first region and said second region containing quantum wires which extend in a cavity direction; and stimulating means for stimulating said first active layer and said second active layer independently of each other.

46. An optical semiconductor device comprising:

a semiconductor substrate;

a first region formed on said substrate, said first region including a first active layer;

a second region formed on said substrate, said second region including a second active layer, at last one of said first region and said second region containing quantum wires which extends in a cavity direction; and an electrode for injecting current into said first active layer and said second active layer independently of each other.

* * * * *

UNITED STATES PATENT AND TRADEMARK OFFICE
CERTIFICATE OF CORRECTION

PATENT NO. :
    5,881,086
DATED : March 9, 1999
INVENTOR(S)
:   SEIICHI MIYAZAWA It is certified that error appears in the above-identified patent and that said Letters Patent is hereby corrected as shown below:

COLUMN 3

Line 4, "incwired" should read --inclined--.

COLUMN 5

Line 16, "of" should be deleted.
Line 19, "of" should be deleted.
Line 22, "of" should be deleted.
Line 25, "of" should be deleted.

COLUMN 10

Line 1, "m group" should read --III group--.

COLUMN 12

Line 5, "amplifies" should read --amplify--.

COLUMN 19

Line 49, "section," should read --sections,--.
Line 50, "fist" should read --first--.

UNITED STATES PATENT AND TRADEMARK OFFICE
CERTIFICATE OF CORRECTION

PATENT NO. : 5,881,086

DATED : March 9, 1999

INVENTOR(S) : SEIICHI MIYAZAWA

It is certified that error appears in the above-identified patent and that said Letters Patent is hereby corrected as shown below:

COLUMN 20

Line 25, "he fist" should read --the first--.

COLUMN 22

Line 29, "second" (second occurrence) should read --said second--.
Line 42, "last" should read --least--.
Line 44, "extends" should read --extend--.

Signed and Sealed this

Fourteenth Day of December, 1999

Attest:

Attesting Officer

Q. TODD DICKINSON

Acting Commissioner of Patents and Trademarks